(12) United States Patent
Shin et al.

(10) Patent No.: US 12,310,095 B2
(45) Date of Patent: May 20, 2025

(54) SEMICONDUCTOR DEVICE AND METHOD OF FABRICATING SAME

(71) Applicant: SAMSUNG ELECTRONICS CO., LTD., Suwon-si (KR)

(72) Inventors: Jongchan Shin, Gwacheon-si (KR); Changmin Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 285 days.

(21) Appl. No.: 18/134,858

(22) Filed: Apr. 14, 2023

(65) Prior Publication Data

US 2023/0274980 A1 Aug. 31, 2023

Related U.S. Application Data

(63) Continuation of application No. 17/405,134, filed on Aug. 18, 2021, now Pat. No. 11,658,073.

(30) Foreign Application Priority Data

Jan. 29, 2021 (KR) .................. 10-2021-0013227

(51) Int. Cl.
*H01L 21/8234* (2006.01)
*H01L 21/308* (2006.01)
*H01L 27/088* (2006.01)
*H10D 84/01* (2025.01)
*H10D 84/03* (2025.01)
*H10D 84/83* (2025.01)

(52) U.S. Cl.
CPC ....... *H10D 84/038* (2025.01); *H01L 21/3086* (2013.01); *H10D 84/0126* (2025.01); *H10D 84/83* (2025.01)

(58) Field of Classification Search
CPC .. H10D 84/038; H10D 84/83; H10D 84/0126; H01L 21/3086; H01L 21/0332; H01L 21/0337
See application file for complete search history.

(56) References Cited

U.S. PATENT DOCUMENTS

| | | |
|---|---|---|
| 9,236,267 B2 | 1/2016 | De et al. |
| 10,049,885 B2 | 8/2018 | Ng et al. |
| 10,103,032 B2 | 10/2018 | Devilliers |
| 10,361,129 B1 | 7/2019 | Sieg et al. |

(Continued)

*Primary Examiner* — Walter H Swanson
(74) *Attorney, Agent, or Firm* — Fish & Richardson P.C.

(57) ABSTRACT

A semiconductor device includes; a substrate including a first region and a second region adjacent to the first region in a first direction, a pair of active patterns adjacently disposed on the substrate, wherein the pair of active patterns includes a first active pattern extending in the first direction and a second active pattern extending in parallel with the first active pattern, a first gate electrode on the first region and extending in a second direction that intersect the first direction across the first active pattern and the second active pattern, and a second gate electrode on the second region and extending in the second direction across the first active pattern and the second active pattern. A width of the first active pattern is greater on the first region than on the second region, a width of the second active pattern is greater on the first region than on the second region, and an interval between the first active pattern and the second active pattern is constant from the first region to the second region.

20 Claims, 43 Drawing Sheets

(56) References Cited

U.S. PATENT DOCUMENTS

| | | |
|---|---|---|
| 10,366,917 B2 | 7/2019 | Zhu et al. |
| 10,483,119 B1 | 11/2019 | Pan et al. |
| 2016/0043001 A1* | 2/2016 | Kim .................. H10D 64/021 438/703 |
| 2020/0058762 A1 | 2/2020 | Hsieh et al. |
| 2022/0102152 A1 | 3/2022 | Chen |

* cited by examiner

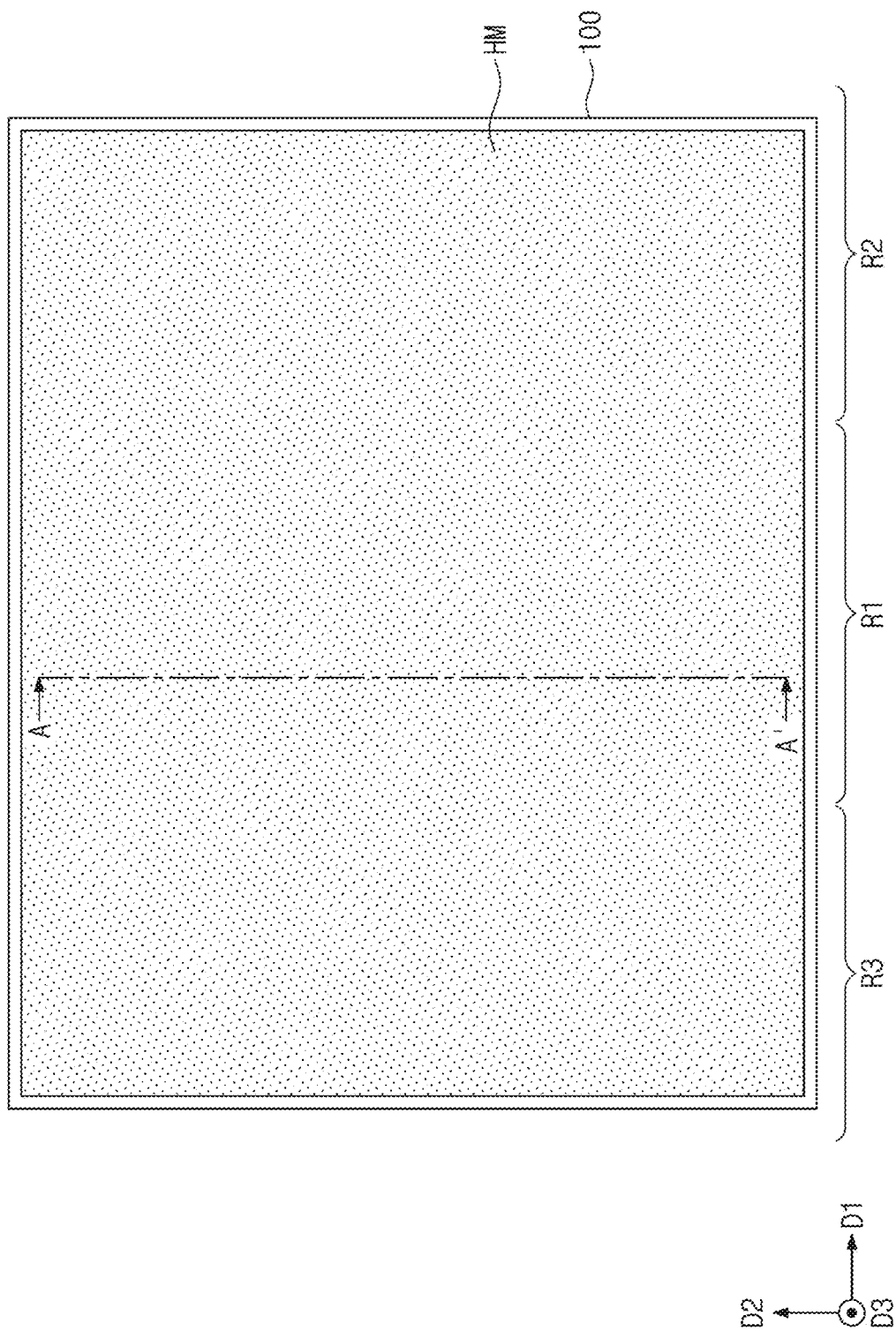

SEMICONDUCTOR DEVICE AND METHOD OF FABRICATING SAME

CROSS-REFERENCE TO RELATED APPLICATION

This is a Continuation of U.S. application Ser. No. 17/405,134, filed Aug. 18, 2021, and a claim priority under 35 U.S.C. § 119 is made to Korean Patent Application No. 10-2021-0013227 filed on Jan. 29, 2021 in the Korean Intellectual Property Office, the subject matter of which is hereby incorporated by reference in its entirety.

BACKGROUND

The inventive concept relates generally to semiconductor devices and methods of fabricating same. More particularly, the inventive concept relates to semiconductor devices including a field effect transistor and methods of fabricating same.

Many contemporary and emerging semiconductor devices include one or more integrated circuit(s) including metal oxide semiconductor field effect transistors (MOSFETs). As the size and design rules of semiconductor devices gradually decrease, the corresponding size(s) of MOSFETs must also decrease. However, the scaling-down of MOSFETs may cause deterioration in the performance characteristics of the semiconductor device. Accordingly, various studies have been conducted to develop methods of fabricating semiconductor devices that provide superior performance characteristics, while complying with the scaling requirements necessary to achieve the integration densities mandated for current, emerging and future semiconductor devices.

SUMMARY

Some embodiments of the inventive concept provide semiconductor devices exhibiting improved performance characteristics and improved reliability. Some embodiments of the inventive concept provide methods of fabricating semiconductor devices exhibiting improved performance characteristics and improved reliability.

According to some embodiments of the inventive concept, a method of fabricating a semiconductor device includes; forming a mold structure including alternatingly stacked sacrificial layers and semiconductor layers on a substrate, forming a hardmask layer on the mold structure, forming a bar pattern extending in a first direction on the hardmask layer, forming a first spacer on a lateral surface of the bar pattern, forming a second spacer on a lateral surface of the first spacer, forming an upper mask pattern extending in a second direction across the second spacer, wherein the second direction intersects the first direction, removing a portion of the second spacer using the upper mask pattern to expose a portion of the lateral surface of the first spacer, forming a hardmask pattern by removing a portion of the hardmask layer exposed by the first spacer and the second spacer, and patterning the mold structure using the hardmask pattern as an etching mask to form an active pattern extending in the first direction.

According to some embodiments of the inventive concept, a method of fabricating a semiconductor device includes; forming a mold structure on a substrate including a first region and a second region adjacent to the first region in a first direction, wherein the mold structure includes alternatingly stacked sacrificial layers and semiconductor layers, forming a bar pattern extending in the first direction on the mold structure, wherein the bar pattern includes a first lateral surface and a second lateral surface opposing the first lateral surface in a second direction, wherein the second direction intersects the first direction, forming first spacers on the first lateral surface and the second lateral surface, forming second spacers on lateral surfaces of the first spacers, forming an upper mask pattern extending in the second direction on the first region across the bar pattern, the first spacers, and the second spacers, removing portions of the second spacers using the upper mask pattern to expose the lateral surfaces of the first spacers on the second region, and patterning the mold structure using the first spacers and the second spacers to form a first active pattern and a second active pattern spaced apart in the second direction.

According to some embodiments of the inventive concept, a semiconductor device includes; a substrate including a first region and a second region adjacent to the first region in a first direction, a pair of active patterns adjacently disposed on the substrate, wherein the pair of active patterns includes a first active pattern extending in the first direction and a second active pattern extending in parallel with the first active pattern, a first gate electrode on the first region and extending in a second direction that intersect the first direction across the first active pattern and the second active pattern, and a second gate electrode on the second region and extending in the second direction across the first active pattern and the second active pattern. A width of the first active pattern is greater on the first region than on the second region, a width of the second active pattern is greater on the first region than on the second region, and an interval between the first active pattern and the second active pattern is constant from the first region to the second region.

BRIEF DESCRIPTION OF THE DRAWINGS

FIGS. 3, 5, 7, 10, 12, 14, 15, 18, 19, 23, 27, 30, 33, and 36 are respective plan views illustrating a method of fabricating a semiconductor device according to embodiments of the inventive concept.

DETAILED DESCRIPTION

Throughout the written description and drawings, like reference numbers and labels denote like or similar elements, components and/or features, Hereinafter, the making and use of semiconductor devices, as well as the use of related fabricating methods, according to embodiments of the inventive concept will be described in relation to the accompanying drawings.

Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width/length; vertical/horizontal; top/bottom; higher/lower; closer/farther; thicker/thinner; proximate/distant; above/below; under/over; upper/lower; center/side; surrounding; overlay/underlay; etc.

Figure 1:
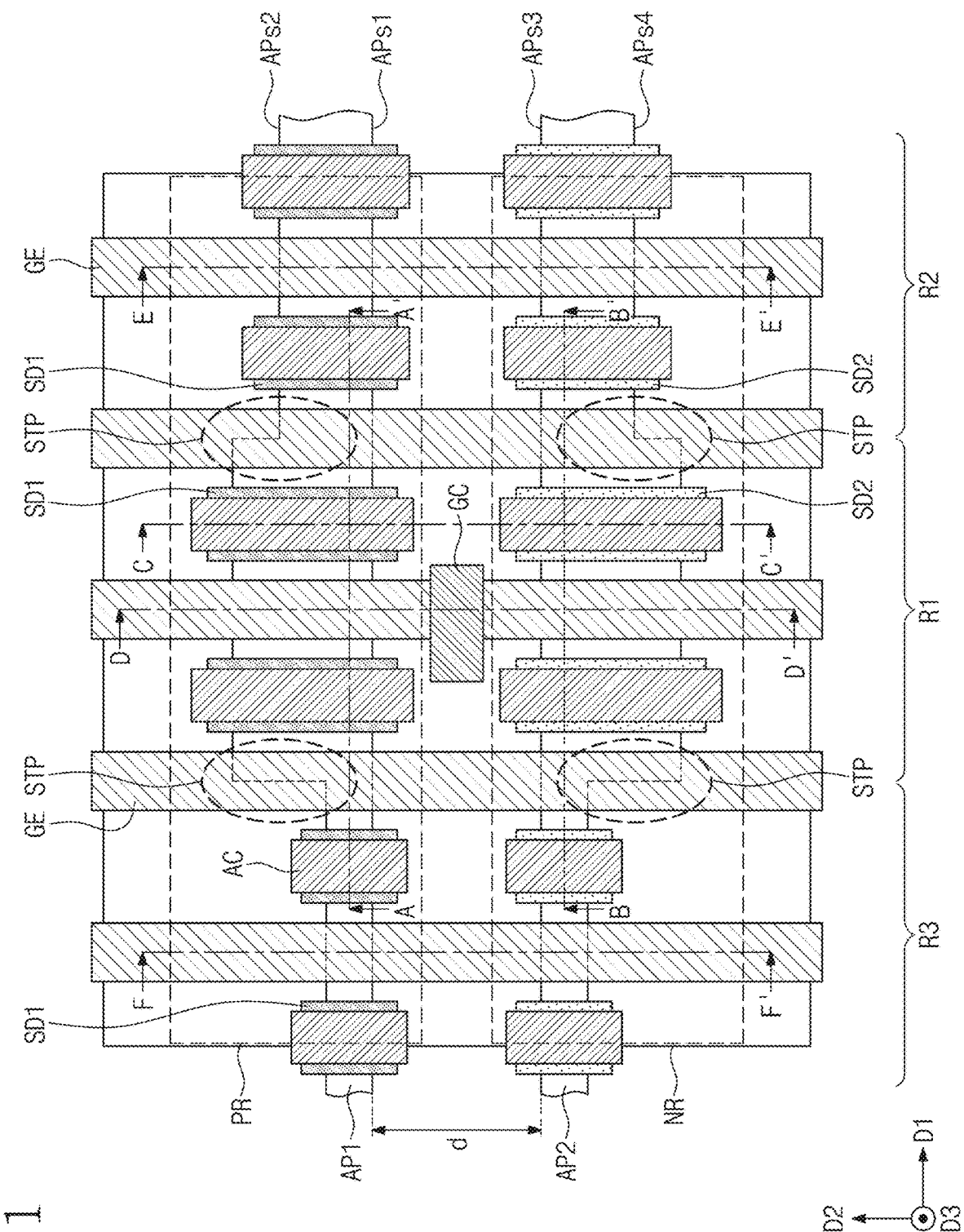
FIG. 1 is a plan (or top-down) view illustrating a semiconductor device according to embodiments of the inventive concept.

Figure (FIG. 1 is a plan view illustrating a semiconductor device according to embodiments of the inventive concept, and FIGS. 2A, 2B, 2C, 2D, 2E, and 2F (collectively, "FIGS. 2A to 2F") are respective cross-sectional views taken along lines A-A', B-B', C-C', D-D', E-E', and F-F' of FIG. 1.

Referring to FIG. 1, a substrate 100 may generally include a first region R1, a second region R2, and a third region R3. The substrate 100 may be a compound semiconductor substrate or a semiconductor substrate including silicon, germanium, or silicon-germanium. In some embodiments, the substrate 100 may be a silicon substrate. The first region R1 may be disposed between the second and third regions R2 and R3, such that the second and third regions R2 and R3 may be spaced apart across the first region R1 in a first direction D1 parallel to an upper surface of the substrate 100 (e.g. a first horizontal direction).

Transistors may be formed on the first, second, and third regions R1, R2, and R3 of the substrate 100. The transistors on the first, second, and third regions R1, R2, and R3 may have corresponding channels lengths that vary one from another. For example, a first channel length of a transistor on the first region R1 may be greater than a second channel length of a transistor on the second region R2, whereas the second channel length may be greater than a third channel length of a transistor on the third region R3. In this regard, a "length" may be measured in the first direction D1. In some embodiments, the transistors on the first, second, and third regions R1, R2, and R3 may be logic cell transistors.

Referring to FIG. 1 and FIGS. 2A to 2F, the substrate 100 may include a P-type MOSFET (PMOSFET) region PR and an N-type MOSFET (NMOSFET) region NR. The PMOSFET region PR and the NMOSFET region NR may be defined by a second trench TR2 formed on an upper portion of the substrate 100. That is, the second trench TR2 may be disposed between the PMOSFET region PR and the NMOSFET region NR. The PMOSFET region PR and the NMOSFET region NR may be spaced apart in a second direction D2 parallel to the upper surface of the substrate 100 across the second trench TR2 (e.g., a second horizontal direction). Here, the second direction D2 may intersect the first direction D1.

A pair of neighboring active patterns AP1 and AP2 may be provided on the substrate 100. The active patterns AP1 and AP2 may be disposed adjacent to one another in the second direction D2. The active patterns AP1 and AP2 may include a first active pattern AP1 that extends in the first direction D1 and a second active pattern AP2 that extends parallel to the first active pattern AP1. The first and second active patterns AP1 and AP2 may be defined by a first trench TR1 formed on the upper portion of the substrate 100. The first trench TR1 may be shallower (e.g., as measured in a third (e.g., a vertical) direction D3 substantially perpendicular to the upper surface of the substrate 100 and intersecting the first direction D1 and the second direction D2) than the second trench TR2. The first and second active patterns AP1 and AP2 may be portions of the substrate 100 that protrude in the third direction D3. In some embodiments, the first active pattern AP1 and the second active pattern AP2 may be respectively provided on the PMOSFET region PR and the NMOSFET region NR.

A device isolation layer ST may substantially fill the first trench TR1 and/or the second trench TR2. In some embodiments, the device isolation layer ST may include a silicon oxide layer. The first and second active patterns AP1 and AP2 may have upper portions that protrude beyond an upper surface of the device isolation layer ST (see FIGS. 2C to 2F). Hence, the device isolation layer ST may not cover the upper portions of the first and second active patterns AP1 and AP2, but may cover lower lateral surfaces of the first and second active patterns AP1 and AP2.

The first active pattern AP1 may include a first channel pattern CH1 on the upper portion thereof. The second active pattern AP2 may include a second channel pattern CH2 on the upper portion thereof. Each of the first and second channel patterns CH1 and CH2 may include a first semiconductor pattern SP1, a second semiconductor pattern SP2, and a third semiconductor pattern SP3 that are sequentially stacked in the third direction. Thus, the first, second, and third semiconductor patterns SP1, SP2, and SP3 may be vertically spaced apart. Each of the first, second, and third semiconductor patterns SP1, SP2, and SP3 may include at least one of silicon (Si), germanium (Ge) and silicon-germanium (SiGe).

The first and second active patterns AP1 and AP2 may extend in the first direction D1 across the first, second, and third regions R1, R2, and R3. An interval 'd' (shown in FIGS. 2D, 2E and 2F) between the first and second active patterns AP1 and AP2 may be constant from the first region R1 to the second region R2. In addition, the interval 'd' between the first and second active patterns AP1 and AP2 may be constant from the second region R2 to the third region R3. Here, unless otherwise explicitly stated, the interval 'd' between the first and second active patterns AP1 and AP2 may be understood as a maximum distance between the first and second active patterns AP1 and AP2. In some embodiments, a distance in the second direction D2 between the first and second active patterns AP1 and AP2 may have a maximum value at a vertical level the same as that of upper surfaces of the first and second active patterns AP1 and AP2.

For example, as shown in FIG. 1, the first active pattern AP1 may have a first lateral surface APs1 facing the second active pattern AP2 and an opposing second lateral surface APs2 opposite to the first lateral surface APs1. The second active pattern AP2 may have a third lateral surface APs3 facing the first lateral surface APs1 of the first active pattern AP1 and an opposing fourth lateral surface APs4. An interval between the first and third lateral surfaces APs1 and APs3 may be the same as the interval 'd' between the first and second active patterns AP1 and AP2, wherein the interval 'd' between the first and third lateral surfaces APs1 and APs3 may be constant regardless of the first, second, and third regions R1, R2, and R3. For example, the interval 'd' between the first and third lateral surfaces APs1 and APs3 on the first region R1 may be the same as that between the first and third lateral surfaces APs1 and APs3 on the second region R2. In addition, the interval 'd' between the first and third lateral surfaces APs1 and APs3 on the second region R2 may be the same as that between the first and third lateral surfaces APs1 and APs3 on the third region R3. In some embodiments, a horizontal distance between the first and third lateral surfaces APs1 and APs3 may decrease with decreasing distance from a lower surface of the substrate 100.

Each of the first and second active patterns AP1 and AP2 may have a width that is different on the first, second, and third regions R1, R2, and R3. (In this regard, a "width" may be measured in the second direction D2). As shown in FIGS. 2D, 2E and 2F, first widths w1 of the first and second active patterns AP1 and AP2 on the first region R1 may be greater than second widths w2 of the first and second active patterns AP1 and AP2 on the second region R2. The second widths w2 of the first and second active patterns AP1 and AP2 on the second region R2 may be greater than third widths w3 of the first and second active patterns AP1 and AP2 on the third region R3.

Here, the first widths w1, second widths w2, and third widths w3 of the first and second active patterns AP1 and AP2 may indicate respective upper surface width of the first and second active patterns AP1 and AP2. In some embodiments, the first and second active patterns AP1 and AP2 may have minimum widths at vertical levels the same as those of the upper surfaces of the first and second active patterns AP1 and AP2. The first and second active patterns AP1 and AP2 may have symmetrical shapes in the second direction D2.

In some embodiments, a distance between the second and fourth lateral surfaces APs2 and APs4 on the first region R1 may be greater than a distance between the second and fourth lateral surfaces APs2 and APs4 on the second region R2. In addition, the distance between the second and fourth lateral surfaces APs2 and APs4 on the second region R2 may be greater than a distance between the second and fourth lateral surfaces APs2 and APs4 on the third region R3.

The first active pattern AP1 may have step differences STP on the second lateral surface APs2. The step differences STP of the first active pattern AP1 may be disposed between the first and second regions R1 and R2 and between the second and third regions R2 and R3. The step differences STP may be portions wherein a width of the first active pattern AP1 changes discontinuously. For example, on the step difference STP between the first and second regions R1 and R2, a width of the first active pattern AP1 may dramatically decrease in the second direction D2, and on the step difference STP between the first and third regions R1 and R3, a width of the first active pattern AP1 may dramatically increase in the second direction D2.

The second active pattern AP2 may have step differences STP on the fourth lateral surface APs4. The step differences STP of the second active pattern AP2 may be disposed between the first and second regions R1 and R2 and between the second and third regions R2 and R3. The step differences STP of the second active pattern AP2 may be symmetrically shaped in relation to the step differences STP of the first active pattern AP1. The first active pattern AP1 may not have the step difference STP on the first lateral surface APs1 facing the second active pattern AP2, and the second active pattern AP2 may not have the step difference STP on the third lateral surface APs3 facing the first active pattern AP1.

First recessions RS1 may be formed in the upper portion of the first active pattern AP1. First source/drain patterns SD1 may then be provided in the first recessions RS1. The first source/drain patterns SD1 may be impurity regions having a first conductivity type (e.g., P-type). A first channel pattern CH1 may be interposed between a pair of first source/drain patterns SD1. For example, the pair of first source/drain patterns SD1 may be connected through the stacked first, second, and third semiconductor patterns SP1, SP2, and SP3.

Second recessions RS2 may be formed on the upper portion of the second active pattern AP2, and second source/drain patterns SD2 may be provided in the second recessions RS2. The second source/drain patterns SD2 may be impurity regions having a second conductivity type (e.g., N-type). A second channel pattern CH2 may be interposed between a pair of second source/drain patterns SD2. For example, the pair of second source/drain patterns SD2 may be connected through the stacked first, second, and third semiconductor patterns SP1, SP2, and SP3.

The first and second source/drain patterns SD1 and SD2 may be epitaxial patterns formed by a selective epitaxial growth process. In some embodiments, each of the first and second source/drain patterns SD1 and SD2 may have an upper surface at a level substantially the same as the upper surface of the third semiconductor pattern SP3. In other embodiments, each of the first and second source/drain patterns SD1 and SD2 may have an upper surface at a level higher than the upper surface of the third semiconductor pattern SP3.

The first source/drain patterns SD1 may include a semiconductor element (e.g., SiGe) having a lattice constant greater than that of a semiconductor element of the substrate 100. Therefore, a pair of first source/drain patterns SD1 may provide the first channel pattern CH1 with compressive stress. The second source/drain patterns SD2 may include the same semiconductor element (e.g., Si) as that of the substrate 100.

Referring to FIG. 1, the first and second source/drain patterns SD1 and SD2 may extend in the second direction D2 across the first and second active patterns AP1 and AP2. For example, on the first region R1, the first and second source/drain patterns SD1 and SD2 may have widths in the second direction D2 greater than widths in the second direction D2 of upper ends of the first and second active patterns AP1 and AP2. On the second region R2, the first and second source/drain patterns SD1 and SD2 may have widths in the second direction D2 greater than widths in the second direction D2 of upper ends of the first and second active patterns AP1 and AP2. On the third region R3, the first and second source/drain patterns SD1 and SD2 may have widths in the second direction D2 greater than widths in the second direction D2 of upper ends of the first and second active patterns AP1 and AP2.

The first source/drain pattern SD1 on the first region R1 may have a width in the second direction D2 greater than a width in the second direction D2 of the first source/drain pattern SD1 on the second region R2, and the width in the second direction D2 of the first source/drain pattern SD1 on the second region R2 may be greater than a width in the second direction D2 of the first source/drain pattern SD1 on the third region R3. In addition, the second source/drain pattern SD2 on the first region R1 may have a width in the second direction D2 greater than a width in the second direction D2 of the second source/drain pattern SD2 on the second region R2, and the width in the second direction D2 of the second source/drain pattern SD2 on the second region R2 may be greater than a width in the second direction D2 of the second source/drain pattern SD2 on the third region R3.

Gate electrodes GE may extend in the second direction D2 across the first and second active patterns AP1 and AP2. The gate electrodes GE may be arranged along the first direction D1 at a regular interval. Each of the gate electrodes GE may vertically overlap the first and second channel patterns CH1 and CH2.

The gate electrode GE may include a first part PO1 interposed between the substrate 100 and the first semiconductor pattern SP1, a second part PO2 interposed between the first semiconductor pattern SP1 and the second semiconductor pattern SP2, a third part PO3 interposed between the second semiconductor pattern SP2 and the third semiconductor pattern SP3, and a fourth part PO4 on the third semiconductor pattern SP3.

Figure 2A:
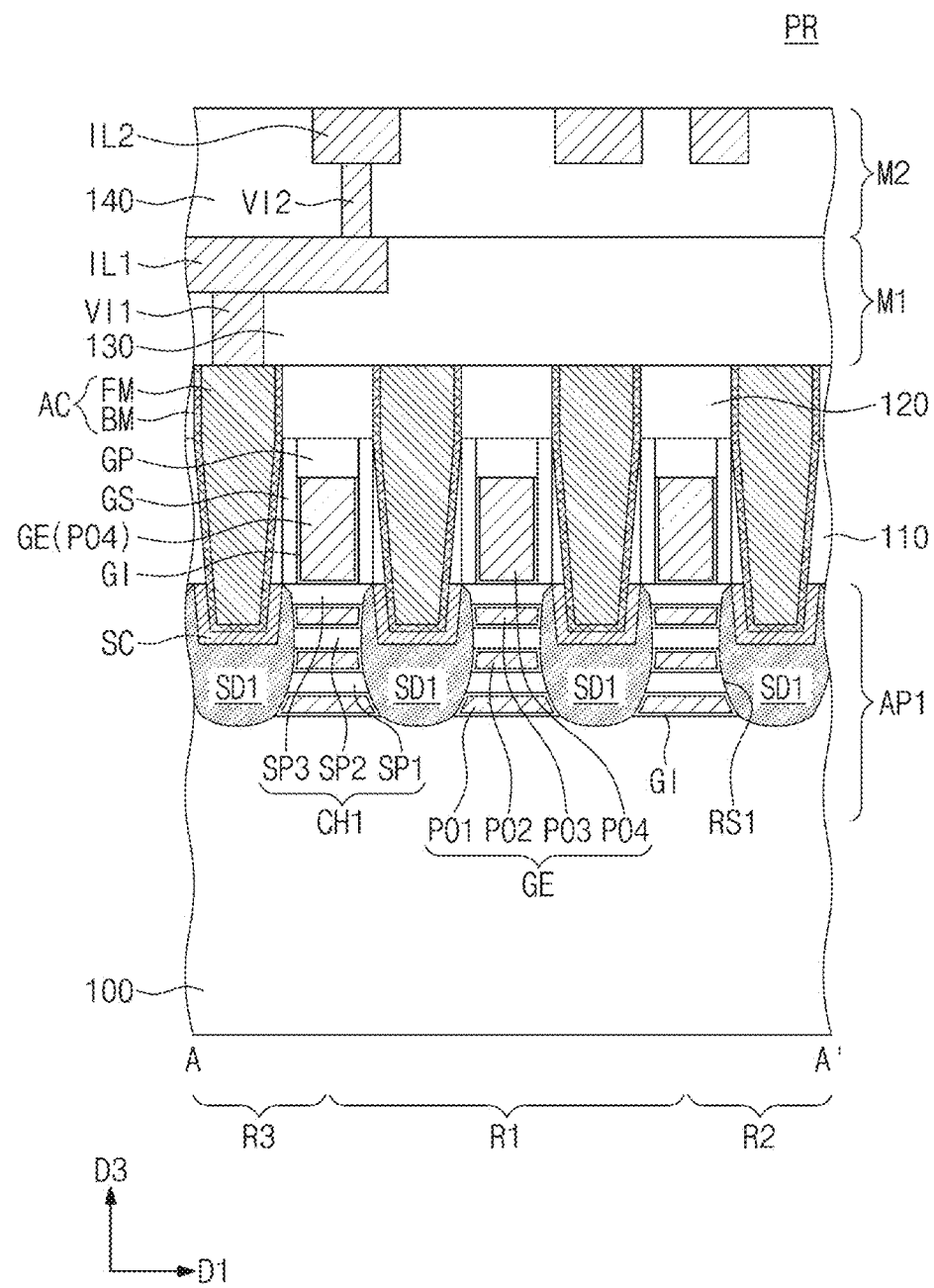
FIGS. 2A, 2B, 2C, 2D, 2E, and 2F respectively illustrate various cross-sectional views taken along lines A-A', B-B', C-C', D-D', E-E', and F-F' of FIG. 1.

As shown in FIG. 2A, on the PMOSFET region PR, the gate electrode GE may have different lengths in the first direction D1 at the first, second, and third parts PO1, PO2, and PO3 thereof. For example, a maximum length in the first direction D1 of the third part PO3 may be greater than a maximum length in the first direction D1 of the second part PO2. A maximum length in the first direction D1 of the first part PO1 may be greater than the maximum length in the first direction D1 of the third part PO3.

The gate electrode GE, as shown in FIGS. 2D, 2E and 2F, may be provided on upper, lower, and both lateral surfaces of each of the first, second, and third semiconductor patterns SP1, SP2, and SP3. That is, a transistor according to embodiments of the inventive concept may be a three-dimensional (3D) field effect transistor (e.g., MBCFET) in which the gate electrode GE at least partially, three-dimensionally surrounds the first and second channel patterns CH1 and CH2.

A pair of gate spacers GS may be disposed on both lateral surfaces of the fourth part PO4 of the gate electrode GE. The gate spacers GS may extend in the second direction D2 along the gate electrode GE. The gate spacers GS may have upper surfaces higher than that of the gate electrode GE. The upper surfaces of the gate spacers GS may be coplanar with that of a first interlayer dielectric layer 110, as described in some additional detail hereafter. The gate spacers GS may include at least one of SiCN, SiCON, and SiN. Alternately, the gate spacers GS may each include a multi-layer formed of at least two of SiCN, SiCON, and SiN.

The step difference STP may be extend across by the gate electrode GE and be disposed between the first region R1 and the third region R3, or between the first region R1 and the second region R2. The gate electrode GE on the step difference STP may vertically overlap and cover the step difference STP. Between two gate electrodes GE disposed on the step differences STP, each of the first and second active patterns AP1 and AP2 may have a constant width in the second direction D2.

A gate capping pattern GP may be provided on the gate electrode GE. The gate capping pattern GP may extend in the second direction D2 along the gate electrode GE. The gate capping pattern GP may include a material having an etch selectivity with respect to the first and second interlayer dielectric layers 110 and 120, as described in some additional detail hereafter. For example, the gate capping pattern GP may include at least one of SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may cover the upper, lower, and both lateral surfaces of each of the first, second, and third semiconductor patterns SP1, SP2, and SP3. The gate dielectric layer GI may cove the upper surface of the device isolation layer ST below the gate electrode GE. See, e.g., FIGS. 2D, 2E and 2F.

The gate electrode GE may include a first metal pattern and a second metal pattern on the first metal pattern. The first metal pattern may be provided on the gate dielectric layer GI and may be adjacent to the first, second, and third semiconductor patterns SP1, SP2, and SP3. The first metal pattern may have a work-function metal that controls a threshold voltage of a transistor. A thickness and composition of the first metal pattern may be adjusted to achieve a desired threshold voltage for a particular transistor. For example, the first, second, and third parts PO1, PO2, and PO3 of the gate electrode GE may be formed of the first metal pattern or a work-function metal.

The first metal pattern may include a metal nitride layer. For example, the first metal pattern may include nitrogen (N) and at least one of titanium (Ti), tantalum (Ta), aluminum (Al), tungsten (W), and molybdenum (Mo). In addition, the first metal pattern may further include carbon (C). In some embodiments, the first metal pattern may include stacked work-function metal layers.

The second metal pattern may include metal having a resistance less than that of the first metal pattern. For example, the second metal pattern may include at least one of tungsten (W), aluminum (Al), titanium (Ti), and tantalum (Ta). In some embodiments, the fourth part PO4 of the gate electrode GE may include the first metal pattern and the second metal pattern on the first metal pattern.

Figure 2B:
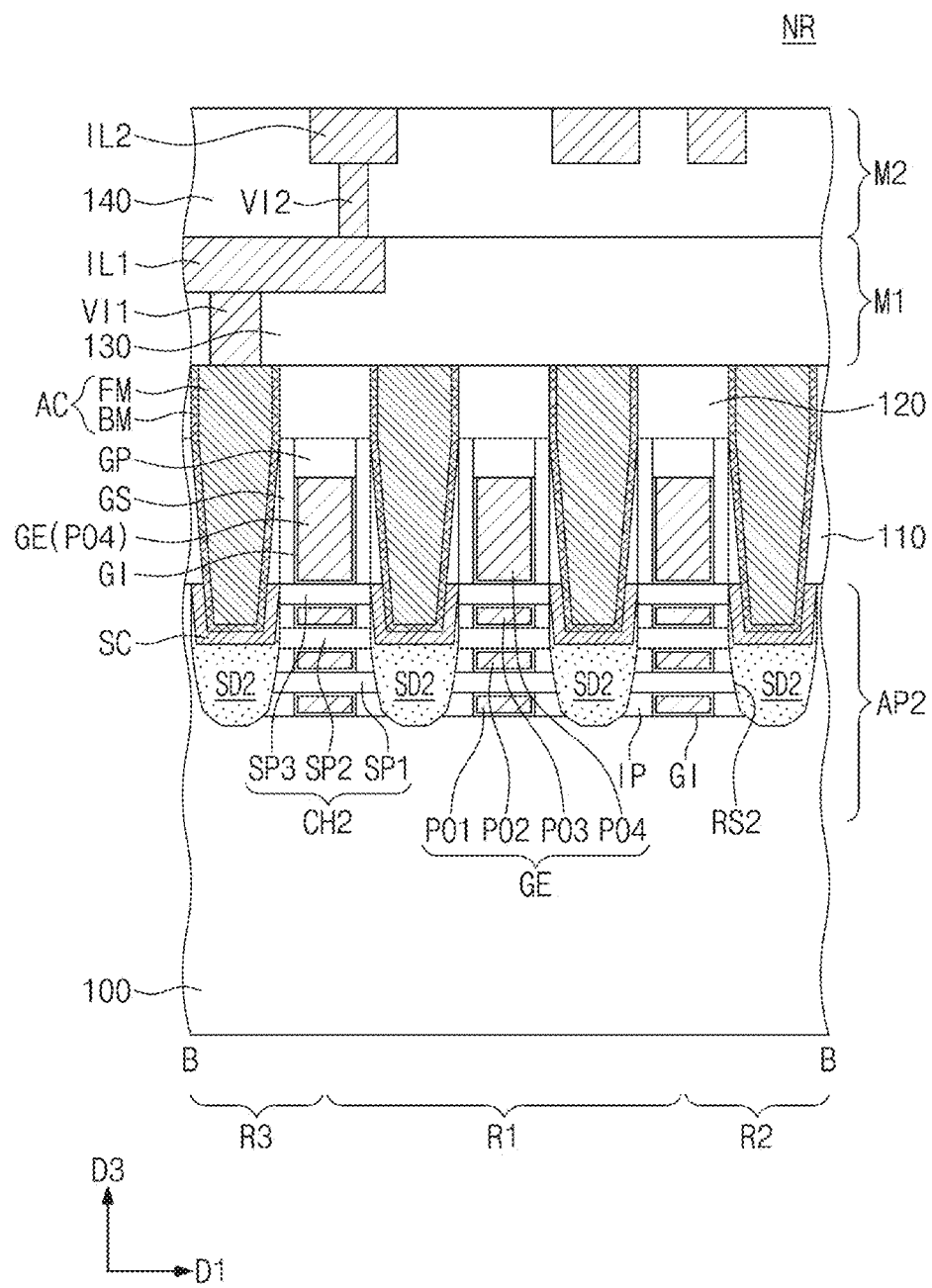
Figure 2C:
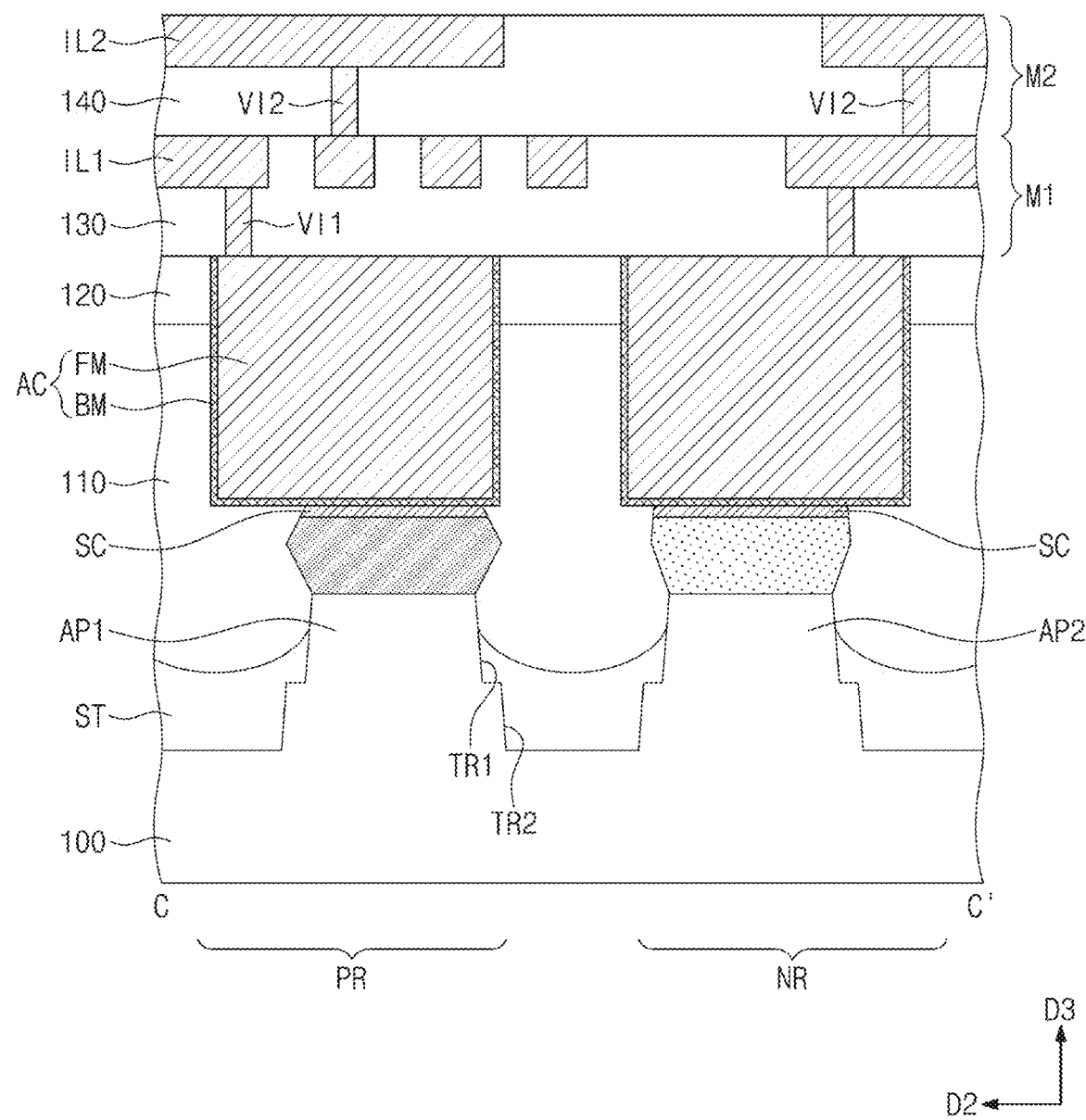
Figure 2D:
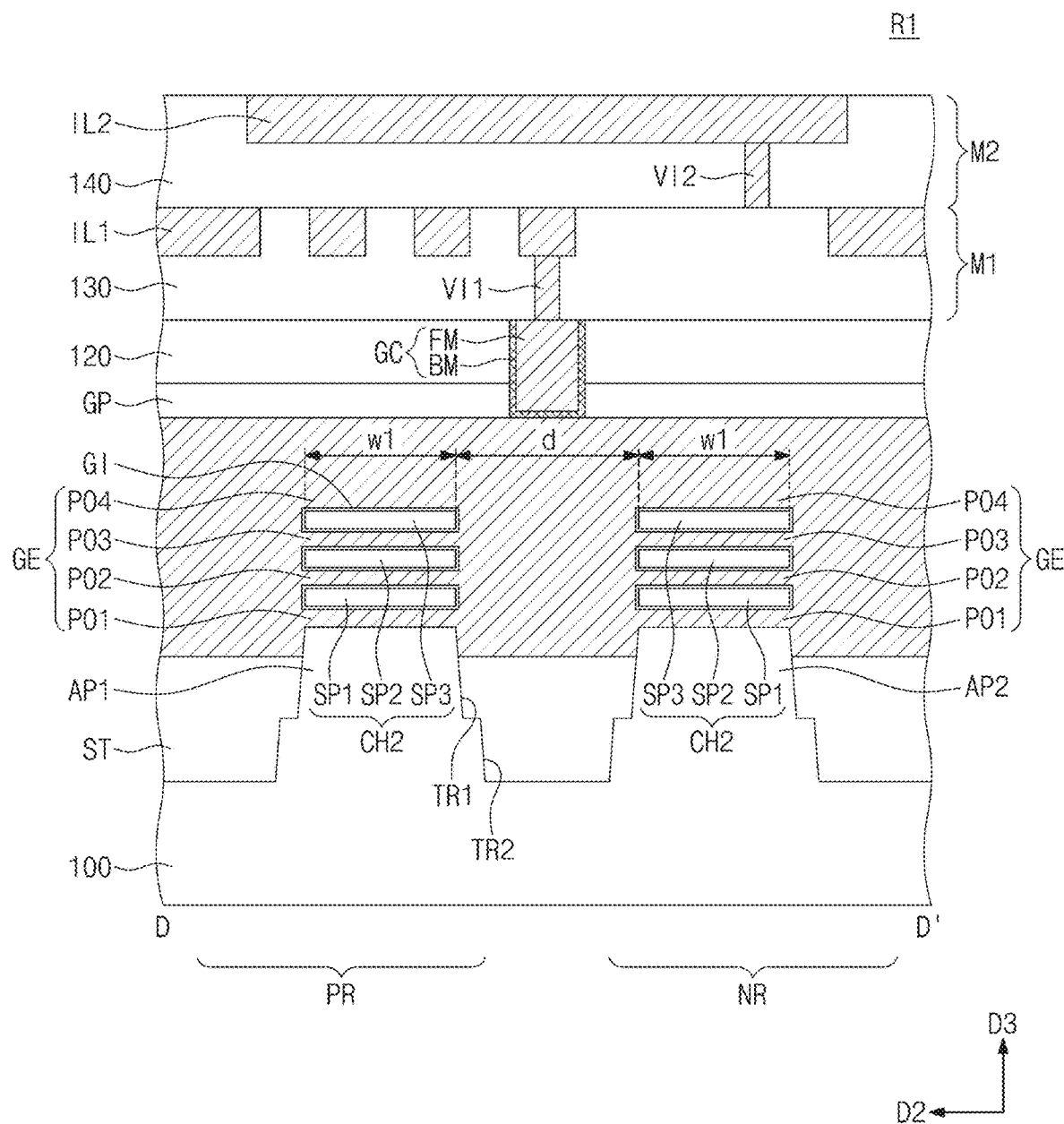
Figure 2E:
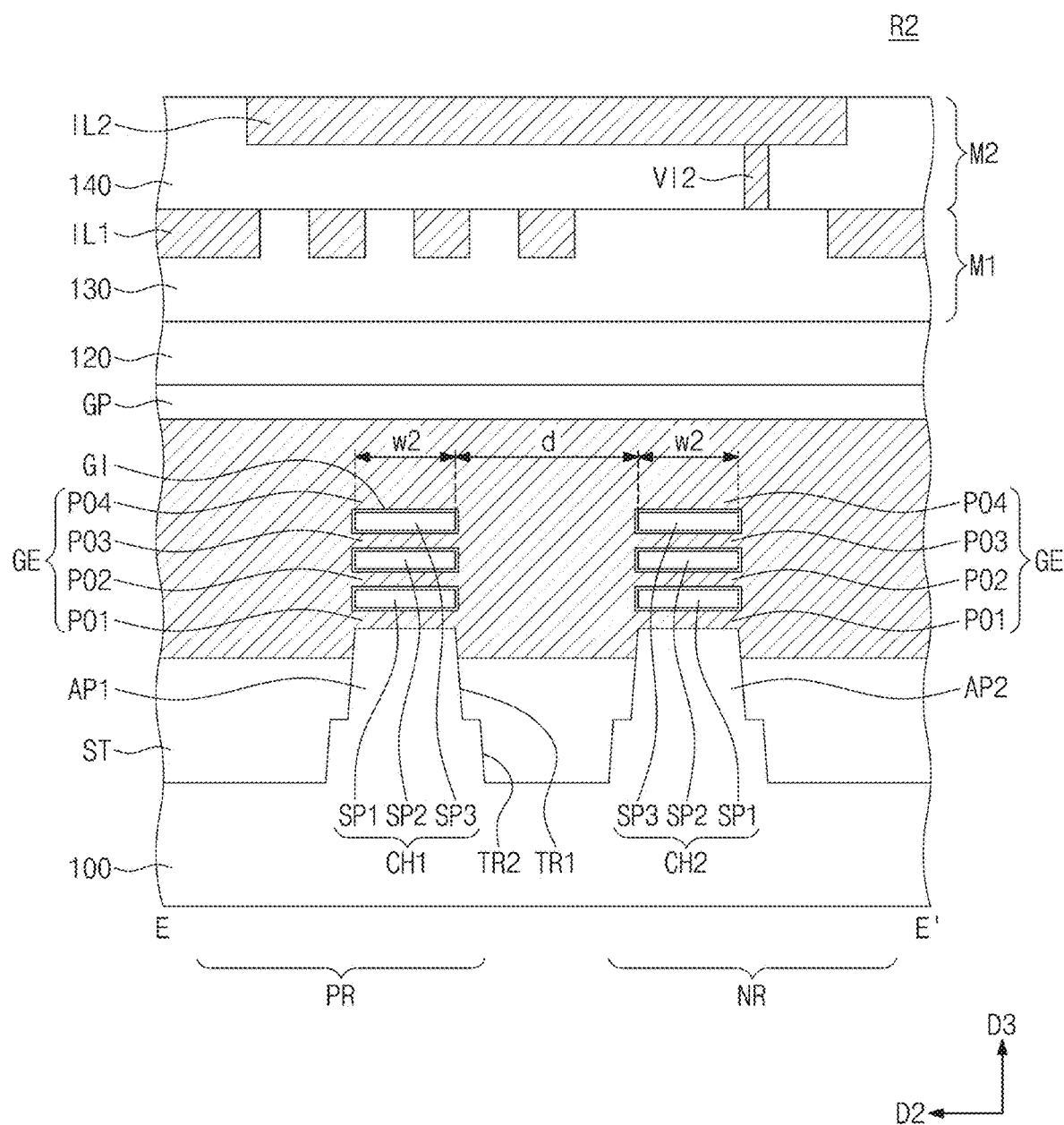
Figure 2F:
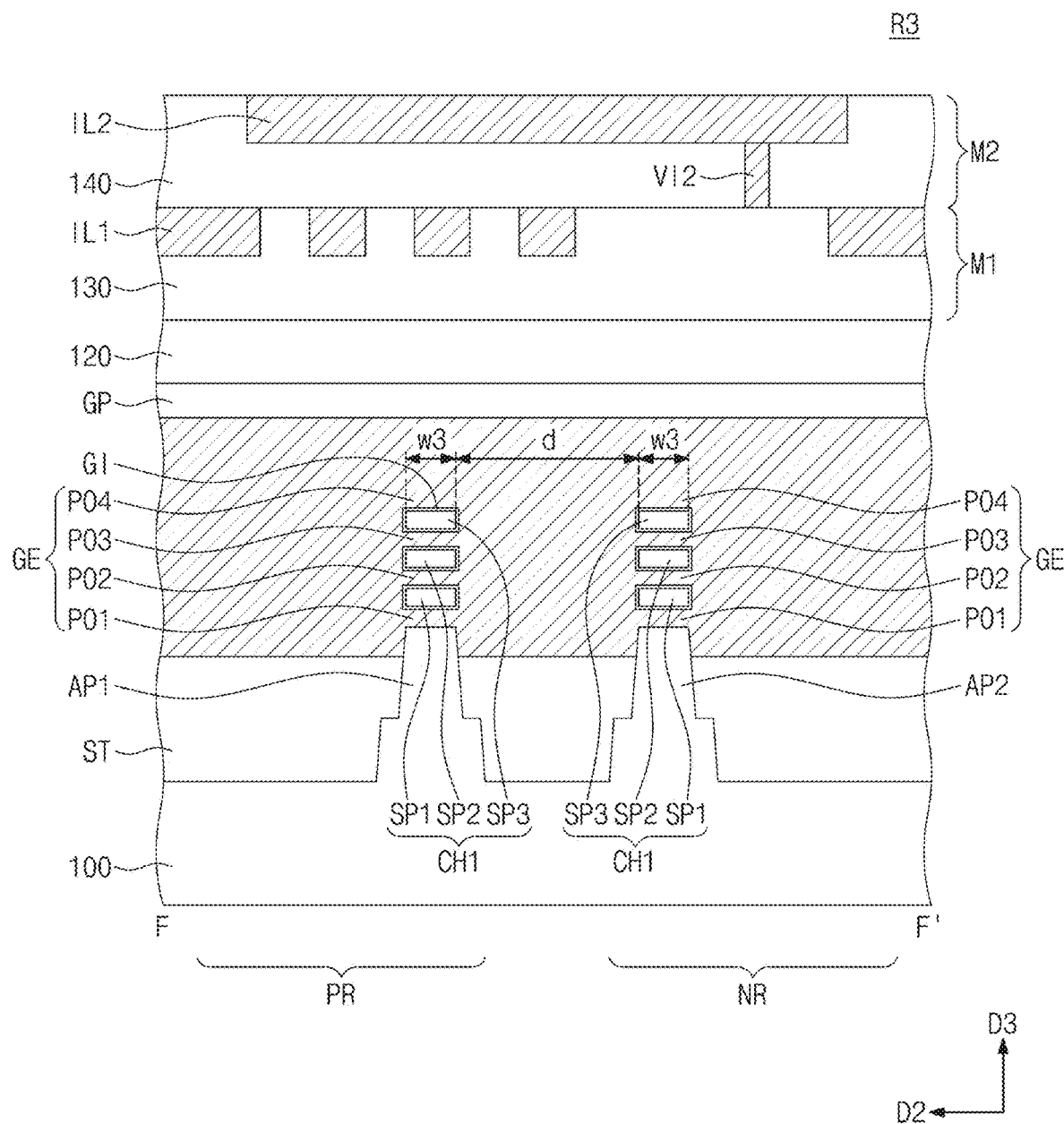

Referring to FIGS. 2A and 2B, dielectric patterns IP may be provided on the NMOSFET region NR. The dielectric patterns IP may be interposed between the second source/drain pattern SD2 and the first, second, and third parts PO1, PO2, and PO3 of the gate electrode GE. The dielectric pattern IP may directly contact the second source/drain pattern SD2. The dielectric patterns IP may separate the second source/drain patterns SD2 from the first, second, and third parts PO1, PO2, and PO3 of the gate electrode GE. In some embodiments, the dielectric patterns IP may be omitted from the PMOSFET region PR. Therefore, a distance between the gate electrode GE and the first source/drain pattern SD1 may be less than a distance between the gate electrode GE and the second source/drain pattern SD2. However, in other embodiments, dielectric patterns may be provided on the PMOSFET region PR. The dielectric patterns may be provided between the second source/drain pattern SD2 and the gate electrode GE, thereby increasing a distance between the second source/drain pattern SD2 and the gate electrode GE.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have an upper surface substantially coplanar with that of the gate capping pattern GP and that of the gate spacer GS. The first interlayer dielectric layer 110 may be provided thereon with a second interlayer dielectric layer 120 that covers the gate capping pattern GP. For example, the first and second interlayer dielectric layers 110 and 120 may include a silicon oxide layer.

Active contacts AC may penetrate the first and second interlayer dielectric layers 110 and 120 to electrical connect the first and second source/drain patterns SD1 and SD2. A pair of active contacts AC may be provided on both sides of the gate electrode GE. In this regard, the active contact AC may have a bar shape extending in the second direction D2.

In some embodiments, the active contact AC may be a self-aligned contact. For example, the gate capping pattern GP and the gate spacer GS may be used to form the active contact AC in a self-alignment approach. For example, the active contact AC may cover at least a portion of a lateral surface of the gate spacer GS. Although not shown, the active contact AC may cover a portion of the upper surface of the gate capping pattern GP.

Silicide patterns SC may be interposed between the active contact AC and the first source/drain pattern SD1, as well as between the active contact AC and the second source/drain pattern SD2. The active contact AC may be electrically connected through the silicide pattern SC to one of the first and second source/drain patterns SD1 and SD2. The silicide pattern SC may include metal silicide, for example, at least one of titanium silicide, tantalum silicide, tungsten silicide, nickel silicide, and cobalt silicide.

A gate contact GC may penetrate the second interlayer dielectric layer 120 and the gate capping pattern GP to electrical connect the gate electrode GE. Each of the active contact AC and the gate contact GC may include a conductive pattern FM and a barrier pattern BM surrounding the conductive pattern FM. For example, the conductive pattern FM may include at least one of aluminum, copper, tungsten, molybdenum, and cobalt. The barrier pattern BM may cover lateral and lower surfaces of the conductive pattern FM. In some embodiments, the barrier pattern BM may include a metal layer and a metal nitride layer. The metal layer may include at least one of titanium, tantalum, tungsten, nickel, cobalt, and platinum. The metal nitride layer may include at least one of a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A third interlayer dielectric layer 130 and a fourth interlayer dielectric layer 140 may be sequentially stacked on the second interlayer dielectric layer 120. The third and fourth interlayer dielectric layers 130 and 140 may include a silicon oxide layer. The third interlayer dielectric layer 130 may cover upper surfaces of the active contacts AC. A first metal layer M1 may be provided in the third interlayer dielectric layer 130. The first metal layer M1 may include first lines IL1 and first vias VI1. The first lines IL1 may extend in the first direction D1. Each of the first lines IL1 may have a linear or bar shape extending in the second direction D2. The first vias VI1 may be correspondingly provided below the first lines IL1 of the first metal layer M1. The first vias VI1 may be correspondingly interposed between the active contacts AC and the first lines IL1. The first line IL1 and its underlying first via VI1 of the first metal layer M1 may be formed by separately performed processes. For example, each of the first line IL1 and the first via VI1 may be formed by a single damascene process.

A second metal layer M2 may be provided in the fourth interlayer dielectric layer 140. The second metal layer M2 may include second lines IL2. Each of the second lines IL2 may have a linear or bar shape and may extend in the first direction D1. For example, the second lines IL2 may extend in parallel in the first direction D1. The second metal layer M2 may further include second vias VI2. The second vias VI2 may be provided below the second lines IL2. The second vias VI2 may be interposed between the first line IL1 and the second lines IL2. In some embodiments, the second line IL2 and its underlying second via VI2 of the second metal layer M2 may be formed as a single component using the same process(es). For example, a dual damascene process may be employed to simultaneously form the second line IL2 and the second via VI2 of the second metal layer M2.

The first lines IL1 of the first metal layer M1 may include a conductive material the same as or different from that of the second lines IL2 of the second metal layer M2. For example, the first and second lines IL1 and IL2 may include at least one of copper (Cu), ruthenium (Rh), cobalt (Co), tungsten (W), aluminum (Al), and molybdenum (Mo).

Those skilled in the art will appreciate that other embodiments of the inventive concept may include additional metal layers (e.g., M3, M4, M5, etc.—not shown) stacked on the fourth interlayer dielectric layer 140. Each of these additional stacked metal layers may include routing lines.

FIGS. 3, 5, 7, 10, 12, 14, 15, 18, 19, 23, 27, 30, 33, and 36 (collectively, "FIGS. 3 to 36") are respective plan views, and FIGS. 4, 6, 8, 11, 13, 16, 20, 24, 28, 31, 34, and 37 (collectively, "FIGS. 4 to 37") are respective cross-sectional views taken along line A-A' in each of FIGS. 3 to 36. Together, FIGS. 3 to 36 and FIGS. 4 to 37 illustrate in one example a method of fabricating a semiconductor device according to embodiments of the inventive concept.

Figure 9:
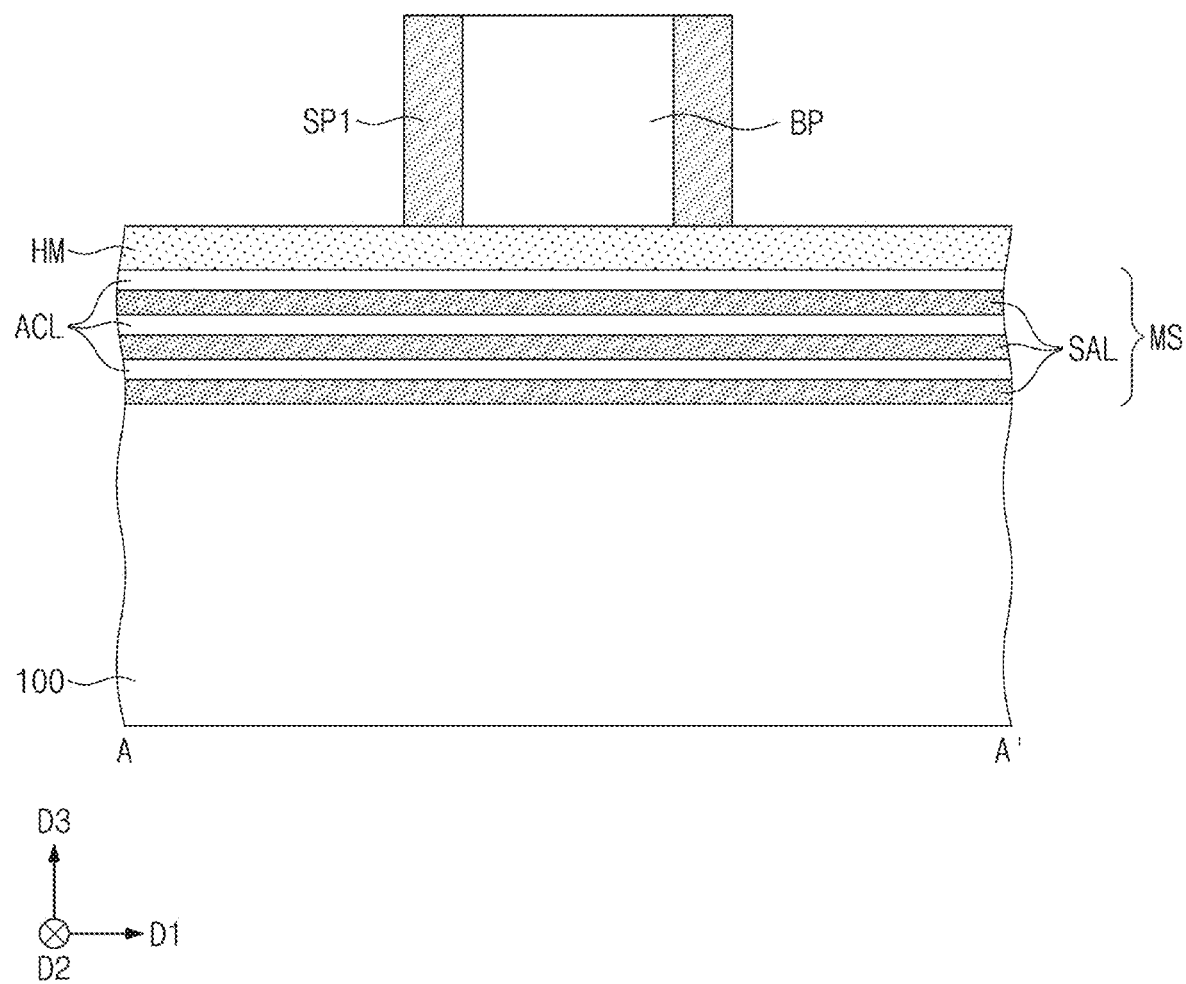
FIG. 9 is a cross-sectional view illustrating a method of fabricating a semiconductor device according to embodiments of the inventive concept.

FIG. 9 is a cross-sectional view illustrating a method of fabricating a semiconductor device according to embodiments of the inventive concept.

Figure 22:
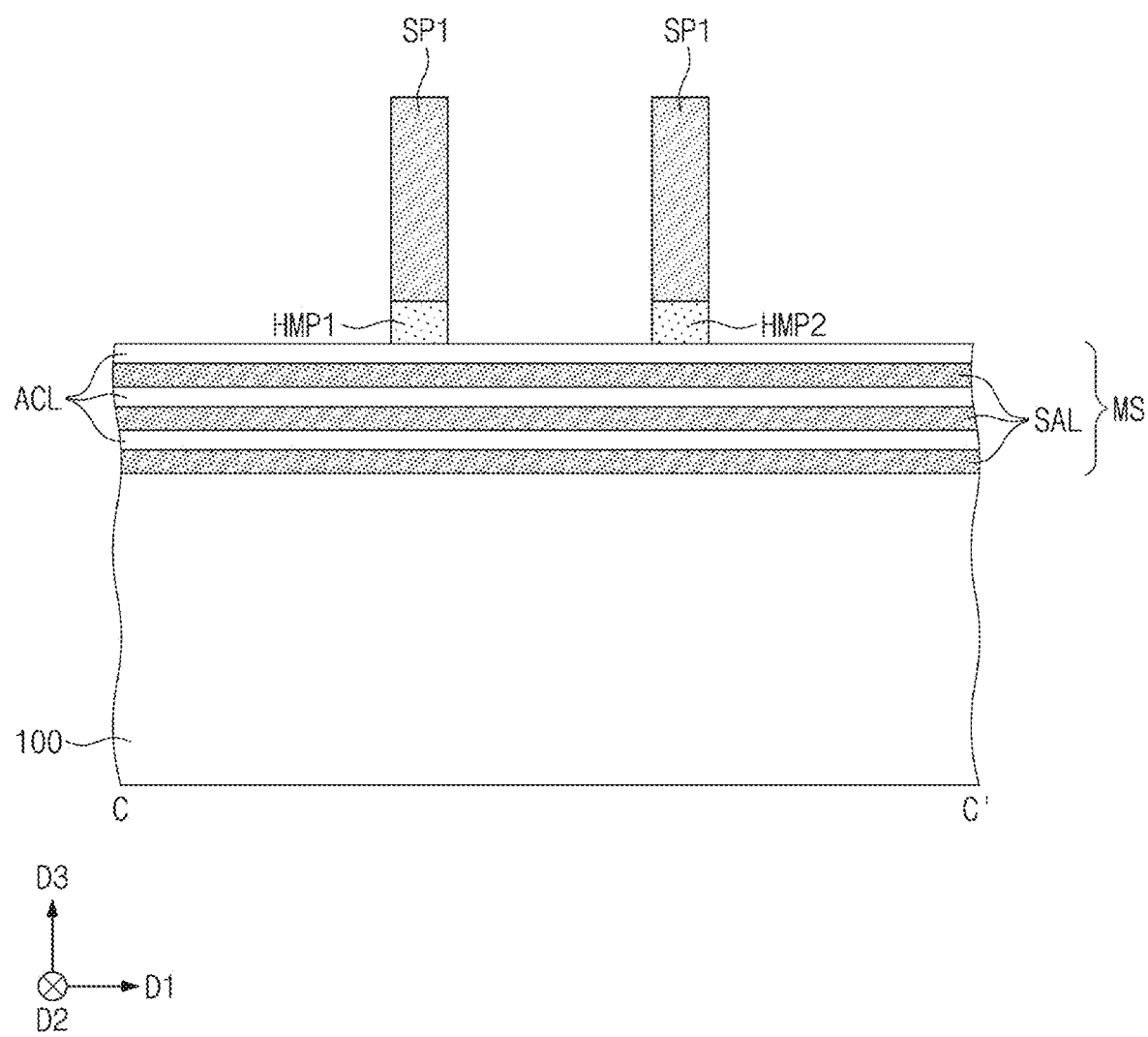
FIGS. 22 and 26 are respective cross-sectional views taken along line C-C' of FIGS. 19 and 23 and illustrate a method of fabricating a semiconductor device according to embodiments of the inventive concept.
Figure 23:
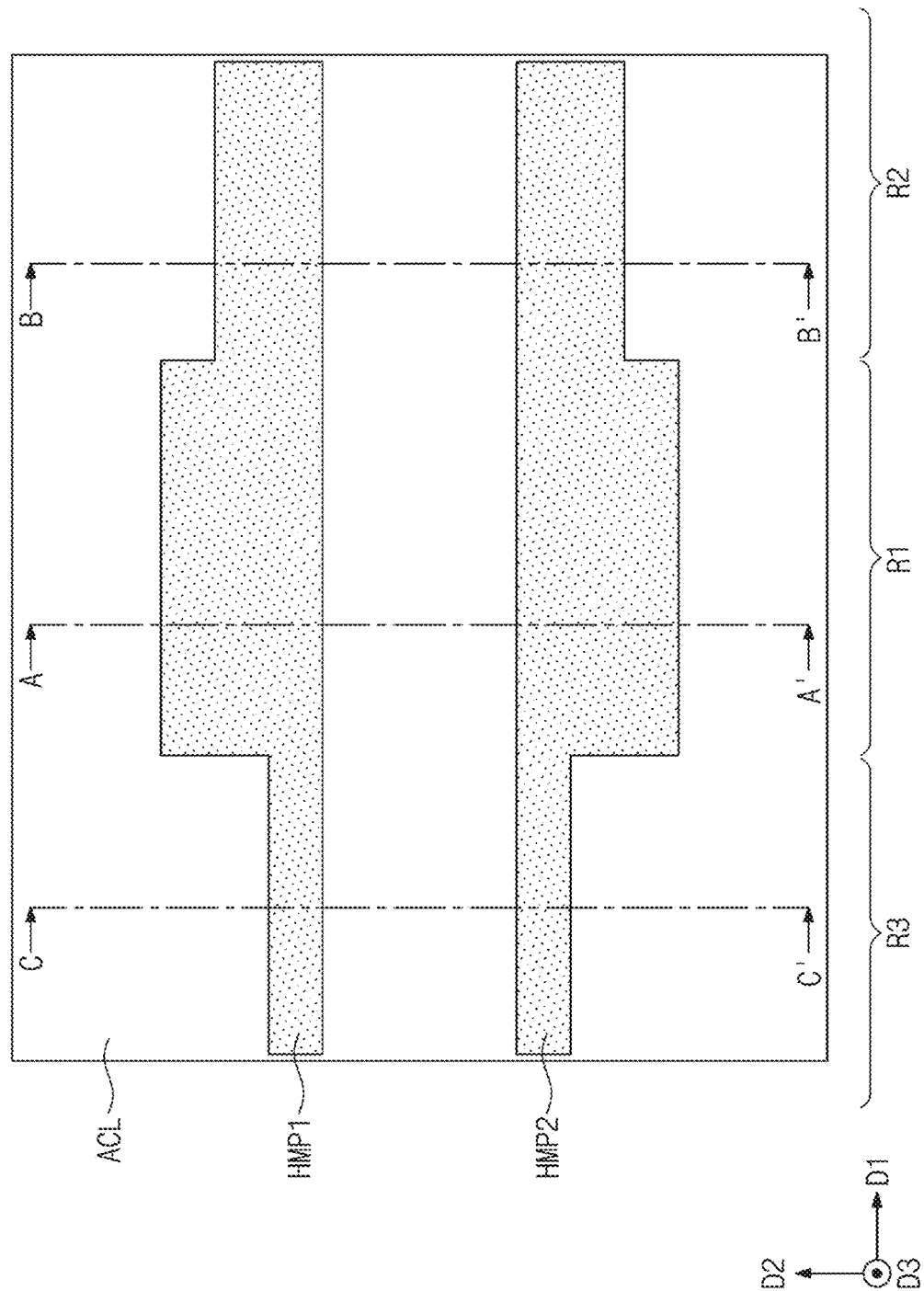
Figure 24:
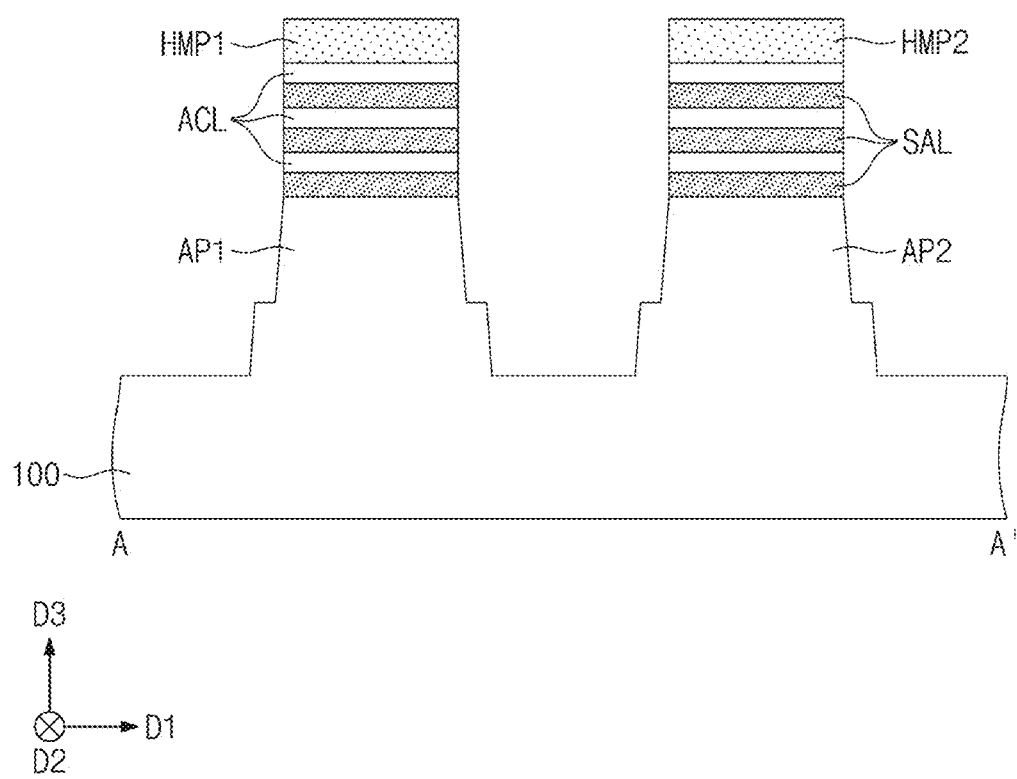
Figure 25:
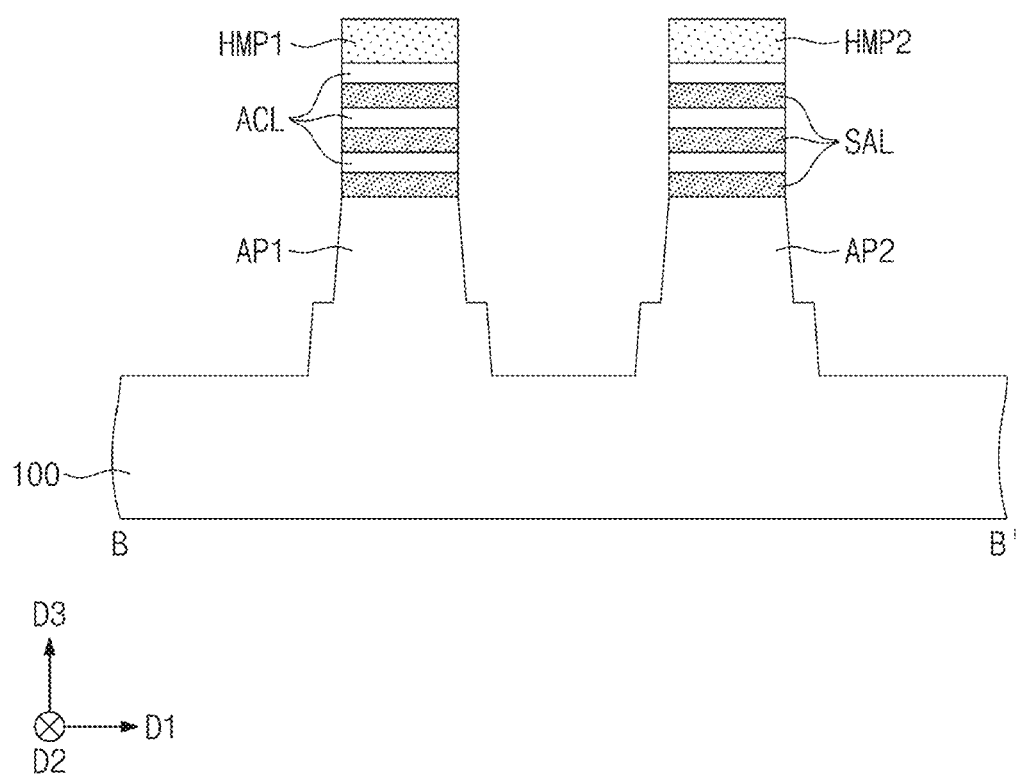
Figure 26:
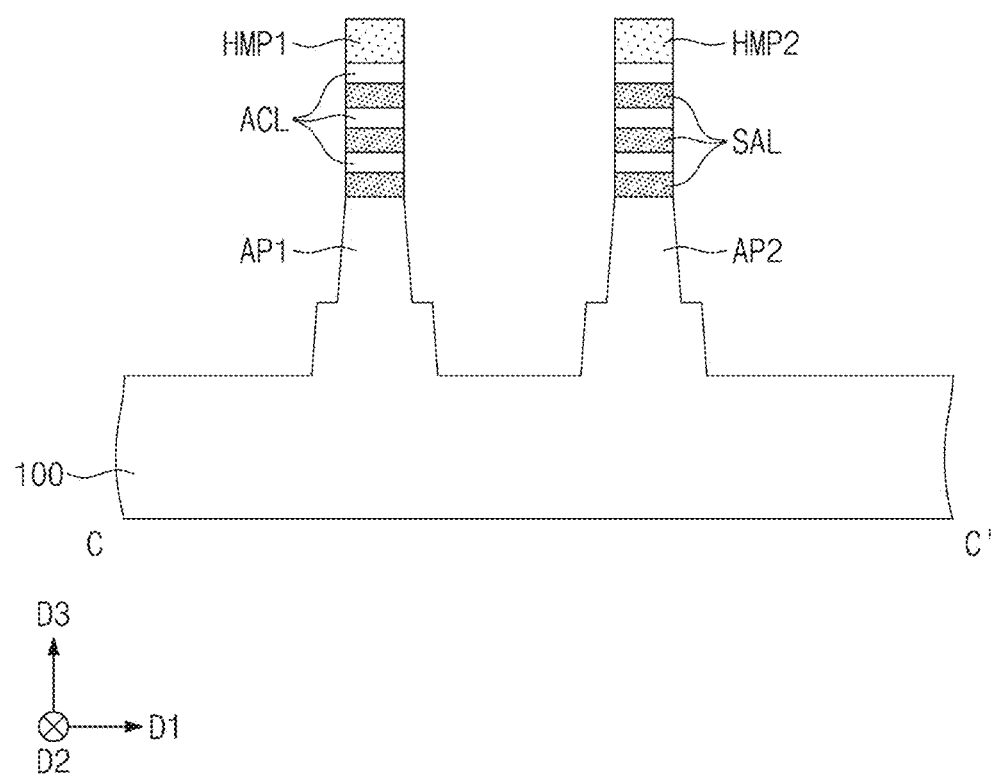

FIGS. 17, 21, 25, 29, 32, 35, and 38 (collectively, "FIGS. 17 to 38") are respective cross-sectional views taken along line B-B' in FIGS. 14, 19, 23, 27, 30, 33, and 36 (collectively, "FIGS. 14 to 36"). Together, FIGS. 17 to 38 and FIGS. 14 to 36 illustrate in one example a method of fabricating a semiconductor device according to embodiments of the inventive concept. FIGS. 22 and 26 are respective cross-sectional views taken along line C-C' of FIGS. 19 and 23 and further illustrate a method of fabricating a semiconductor device according to embodiments of the inventive concept.

Figure 4:
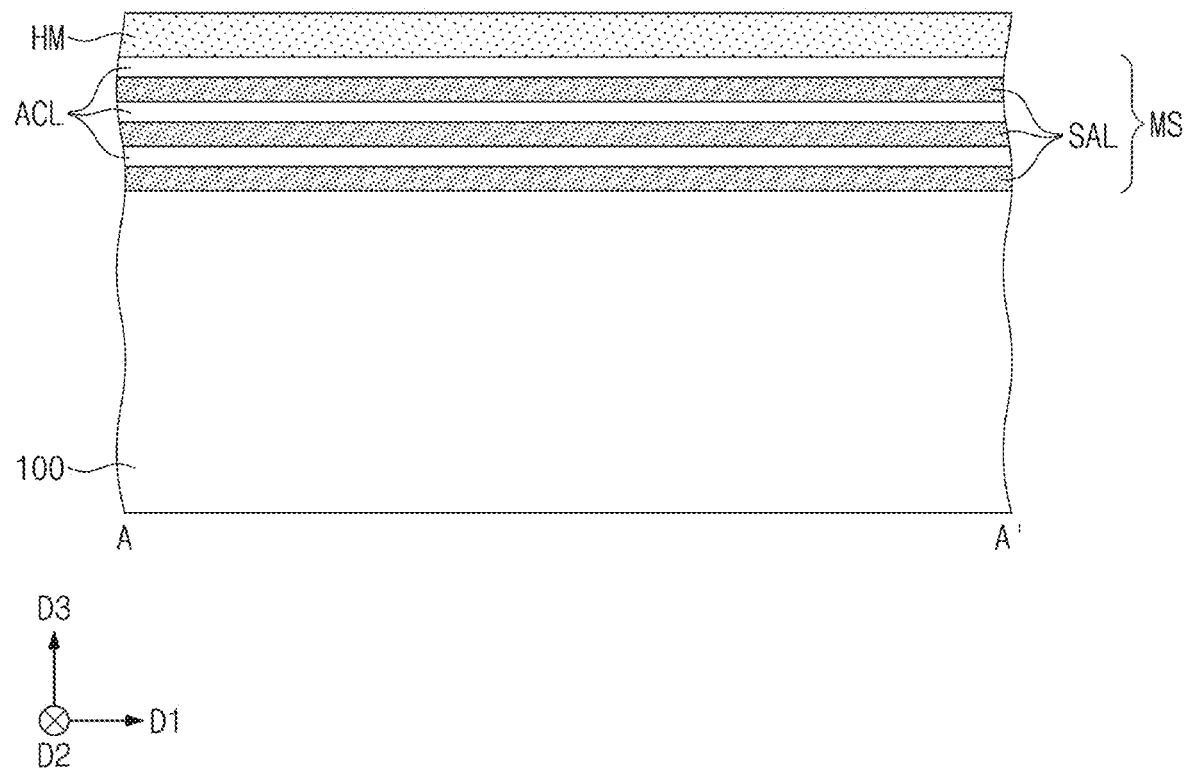
FIGS. 4, 6, 8, 11, 13, 16, 20, 24, 28, 31, 34, and 37 are respective cross-sectional views taken along line A-A' of FIGS. 3, 5, 7, 10, 12, 15, 19, 23, 27, 30, 33, and 36 and illustrate a method of fabricating a semiconductor device according to embodiments of the inventive concept.

Referring to FIGS. 3 and 4, a substrate 100 may be provided which includes a first region R1, a second region R2, and a third region R3. A mold structure MS may be formed on the first, second, and third regions R1, R2, and R3 of the substrate 100. The mold structure MS may include sacrificial layers SAL and active layers ACL that are alternately stacked on the substrate 100. The sacrificial layers SAL may include one of silicon (Si), germanium (Ge), and silicon-germanium (SiGe), and the active layers ACL may include another at least one of silicon (Si), germanium (Ge), and silicon-germanium (SiGe). For example, the sacrificial layers SAL may include silicon-germanium (SiGe), and the active layers ACL may include silicon (Si). Each of the sacrificial layers SAL may have a germanium concentration ranging from about 10% to about 30%.

A hardmask layer HM may be formed on the mold structure MS. The hardmask layer HM may be formed on an entirety of the substrate 100, and thus may completely cover an upper surface of the mold structure MS. The hardmask layer HM may include, for example, a silicon nitride layer.

Figure 5:
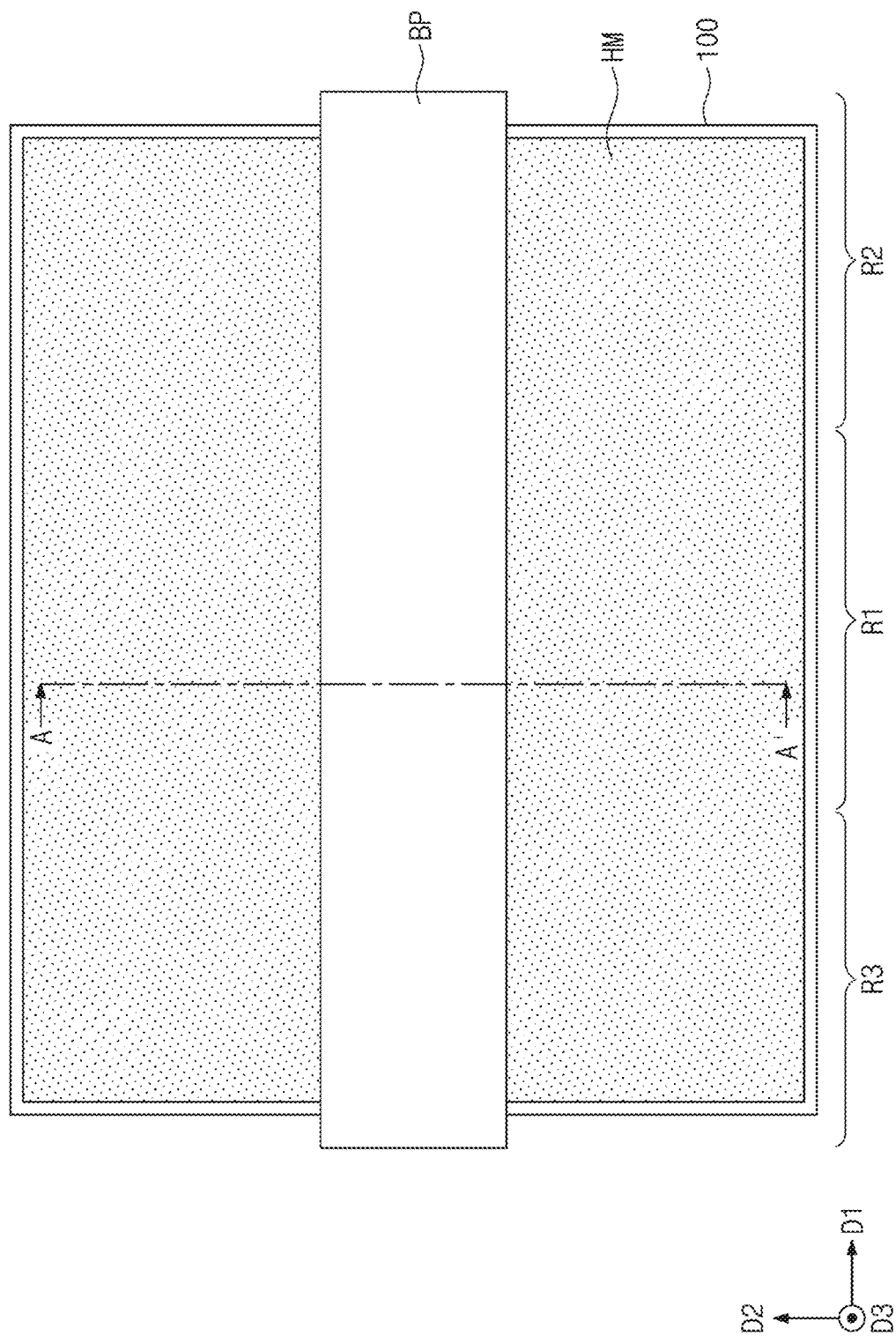
Figure 6:
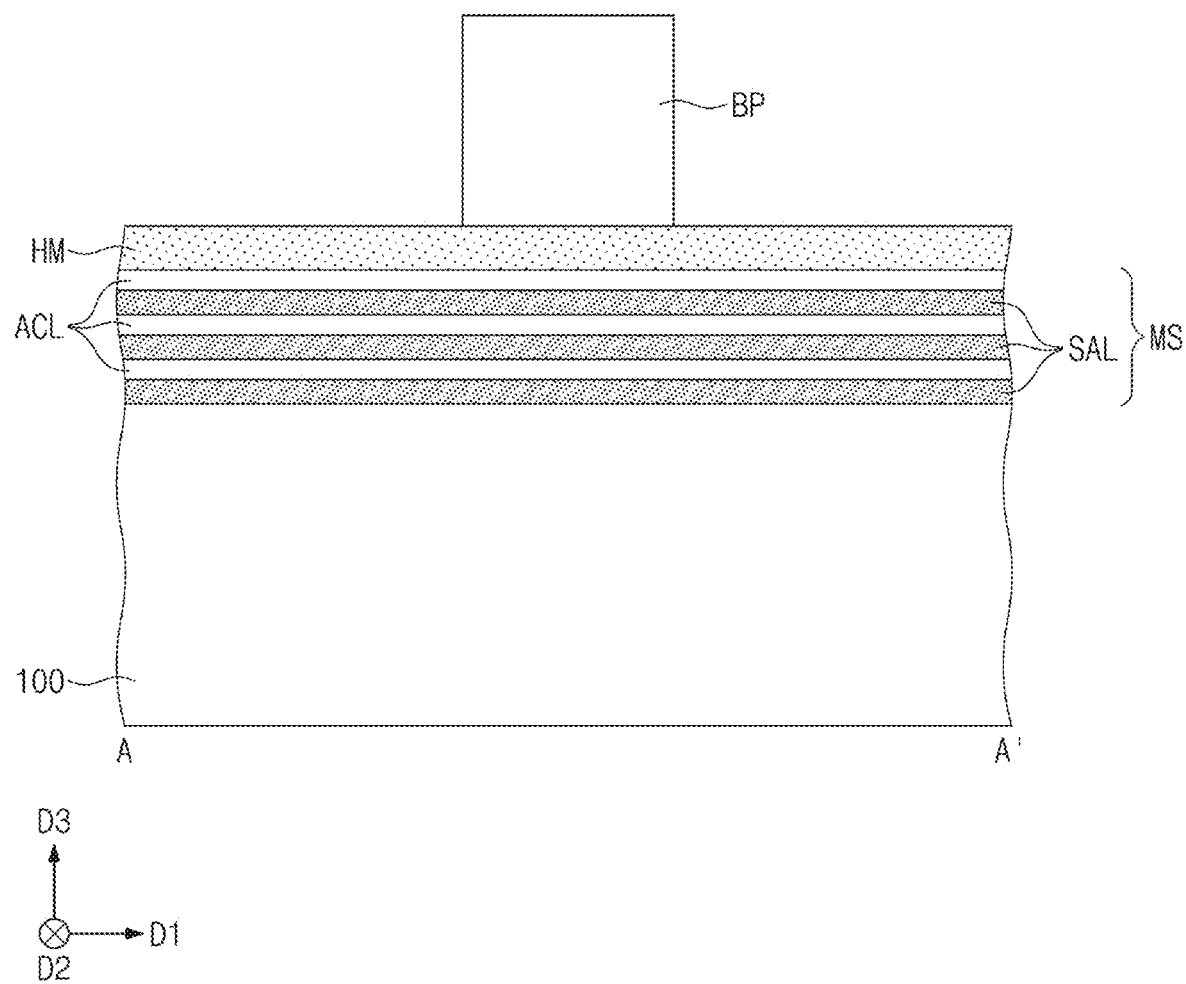

Referring to FIGS. 5 and 6, a bar pattern BP may be formed on the hardmask layer HM. The bar pattern BP may extend in the first direction D1 across the substrate 100. For example, the bar pattern BP may extend from the third region R3 via the first region R1 onto the second region R2 of the substrate 100. The formation of the bar pattern BP may include performing a deposition process to form on the hardmask layer HM a dielectric layer whose thickness is greater than that of the hardmask layer HM, and then patterning the dielectric layer. The bar pattern BP may include, for example, at least one of silicon oxide, silicon nitride, and silicon oxynitride.

Figure 7:
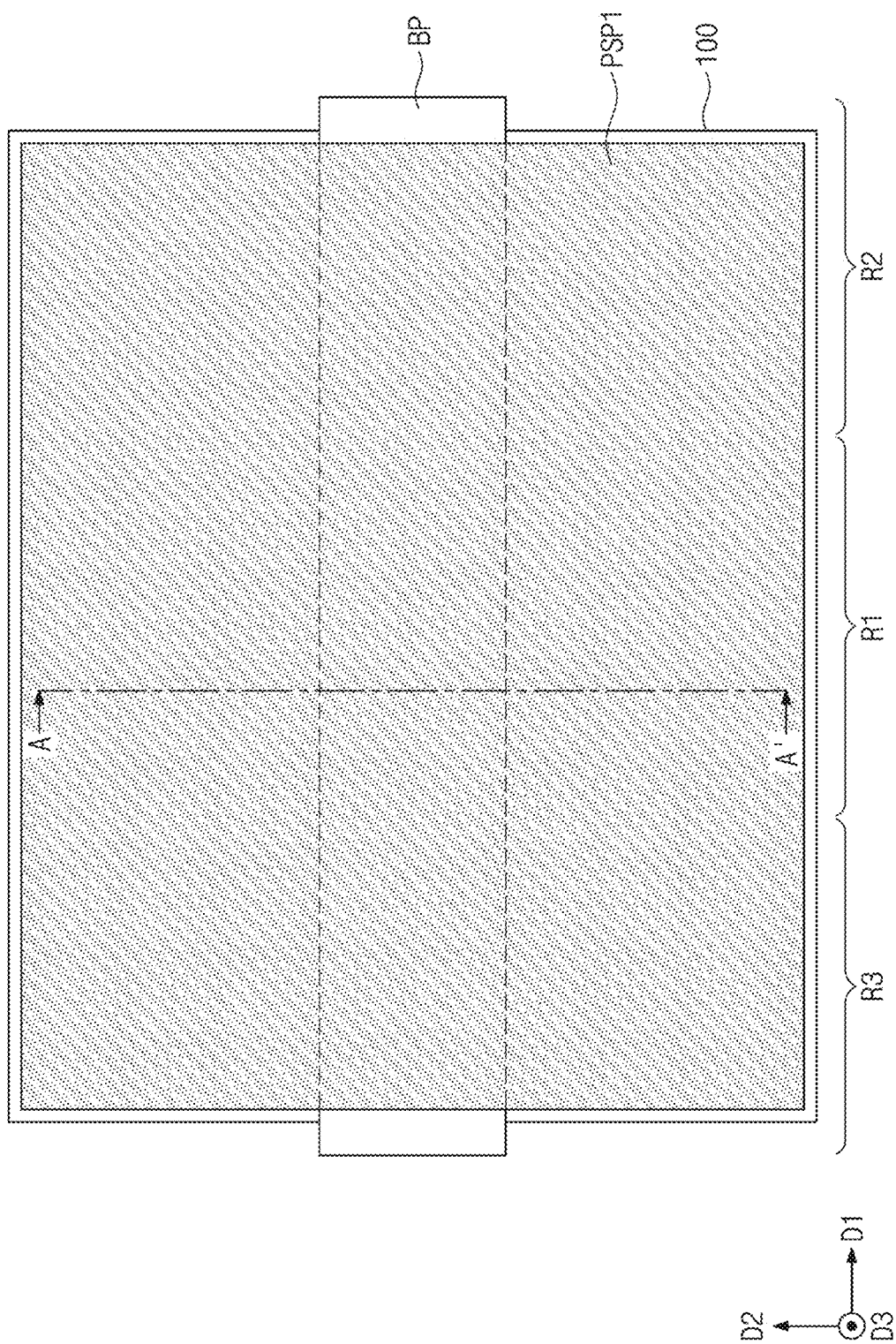
Figure 8:
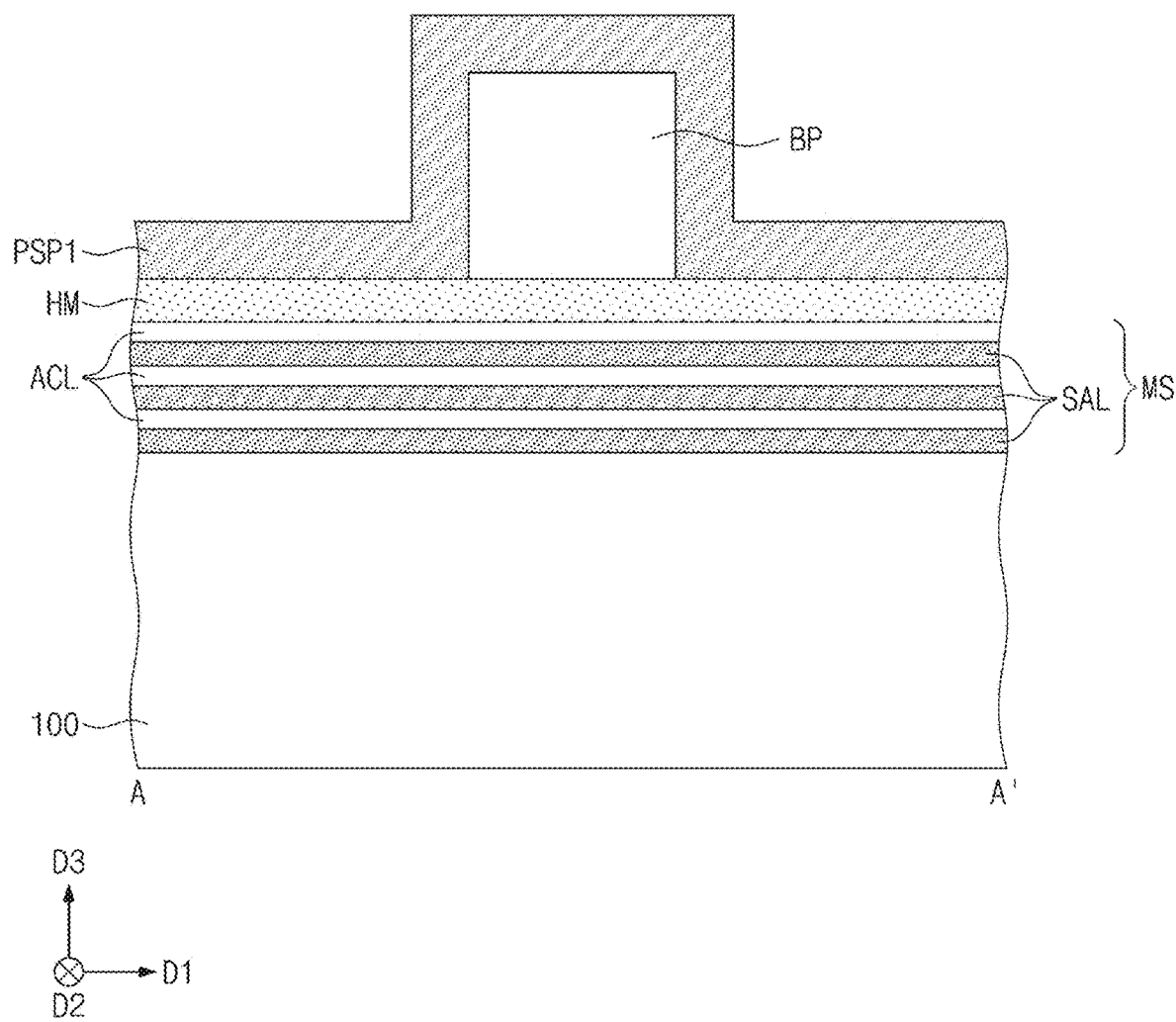

Referring to FIGS. 7 and 8, a first preliminary spacer layer PSP1 may be formed on the hardmask layer HM and the bar pattern BP. The formation of the first preliminary spacer layer PSP1 may include performing an atomic layer deposition (ALD) process to form an ALD oxide layer on the hardmask layer HM and the bar pattern BP, and then performing densification of the ALD oxide layer. A rapid thermal process may be used to execute the densification of the ALD oxide layer. For example, the rapid thermal process may be performed for about 10 seconds to about 120 seconds at a temperature of about 500° C. to about 900° C. in an atmosphere including $N_2$ and/or $O_2$. The first preliminary spacer layer PSP1 may conformally cover the hardmask layer HM and the bar pattern BP.

Referring to FIG. 9, the substrate 100 may undergo an etching process to form first spacers SP1. A portion of the first preliminary spacer layer PSP1 may be removed in the etching process. Other portions of the first preliminary spacer layer PSP1 may remain on lateral surfaces of the bar pattern BP, thereby forming the first spacers SP1. For example, an anisotropic etching process may be selected as the etching process for forming the first spacers SP1.

Figure 10:
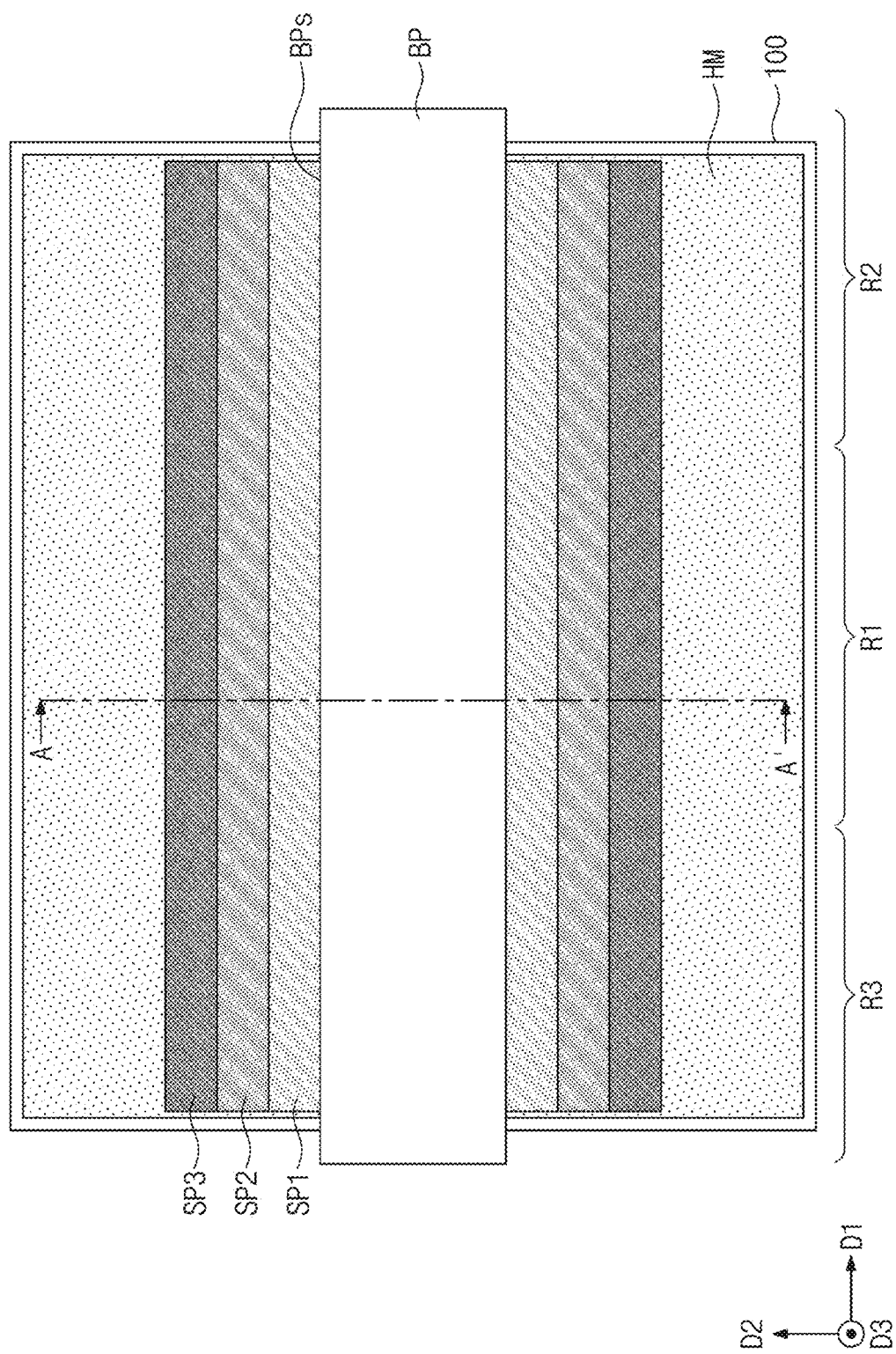
Figure 11:
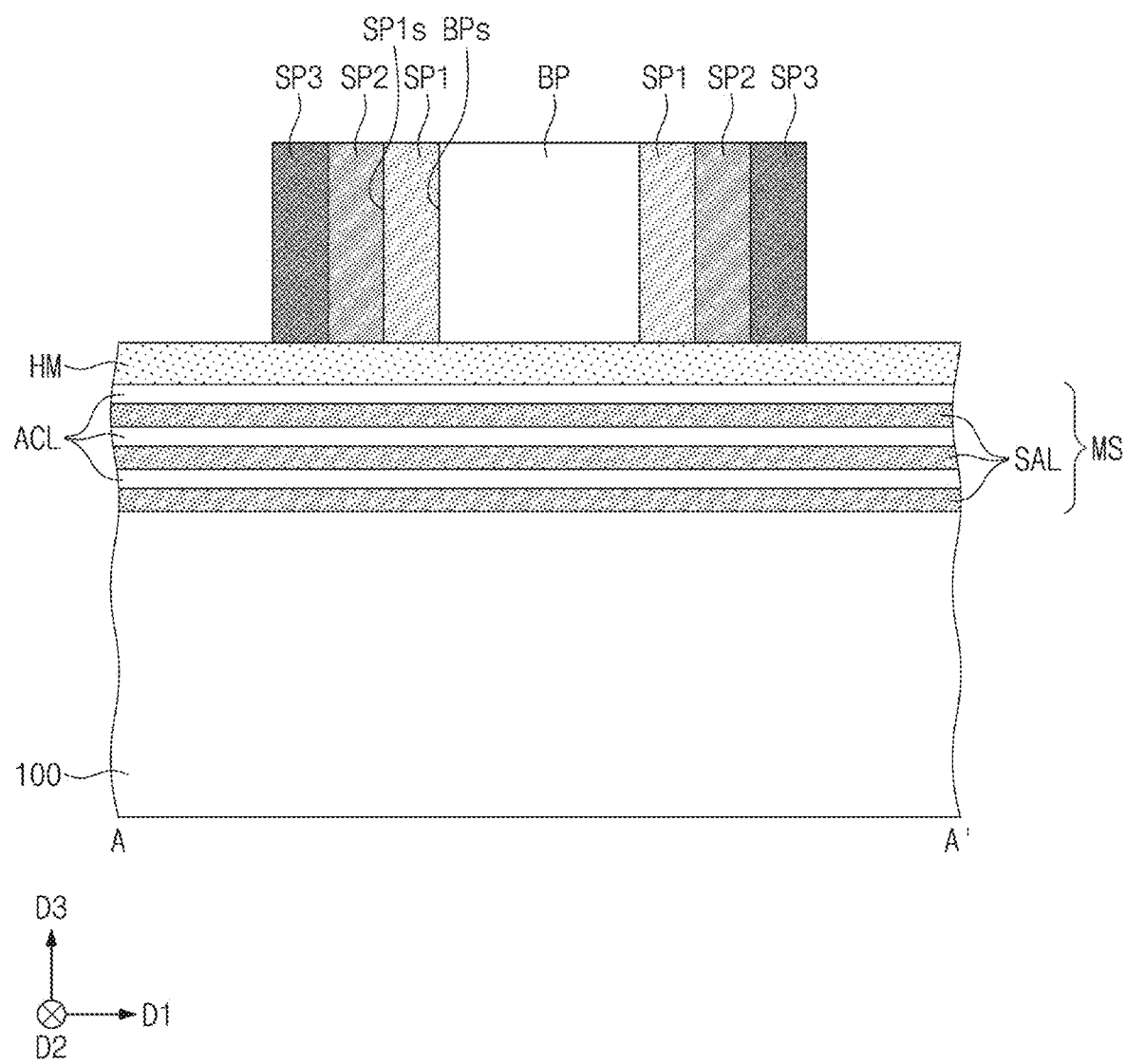

Referring to FIGS. 10 and 11, a second spacer SP2 and a third spacer SP3 may be sequentially formed on a lateral surface SP1s of the first spacer SP1. The formation of the second spacer SP2 may include forming a second preliminary spacer layer that conformally covers the first spacer SP1 and the bar pattern BP, and then removing a portion of the second preliminary spacer layer. The partial removal of the second preliminary spacer layer may include performing, for example, an anisotropic etching process. The anisotropic etching process may allow the second preliminary spacer layer to have a remaining portion on the lateral surface SP1s of the first spacer SP1, which remaining portion may correspond to the second spacer SP2.

The formation of the second spacer SP2 may be followed by the formation of the third spacer SP3. The formation of the third spacer SP3 may include forming a third preliminary spacer layer that conformally covers the first spacer SP1, the second spacer SP2, and the bar pattern BP, and then removing a portion of the third preliminary spacer layer. The partial removal of the third preliminary spacer layer may include, for example, performing an anisotropic etching process. The anisotropic etching process may allow the third preliminary spacer layer to have a remaining portion on a lateral surface SP2s of the second spacer SP2, which remaining portion may correspond to the third spacer SP3.

Figure 12:
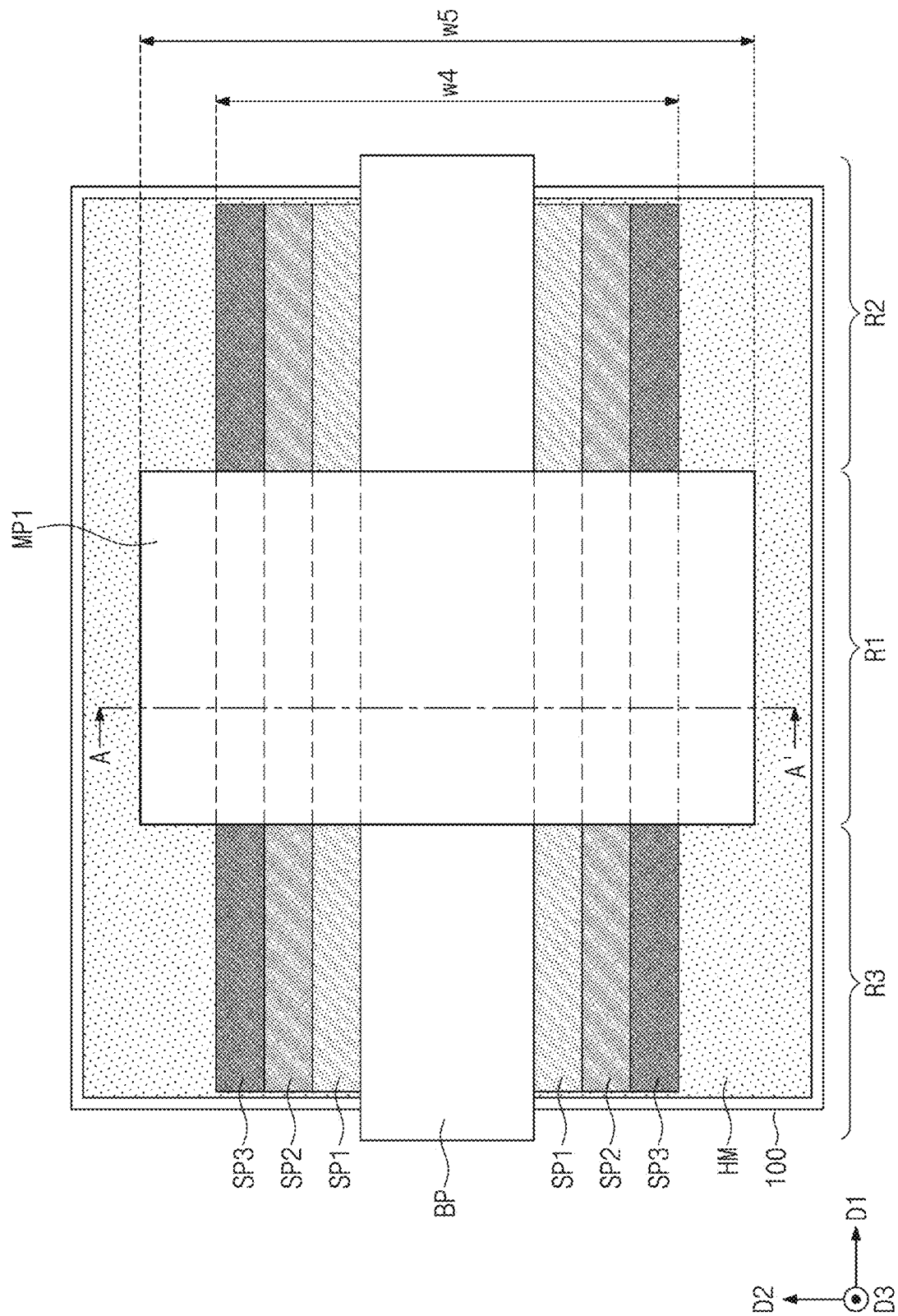
Figure 13:
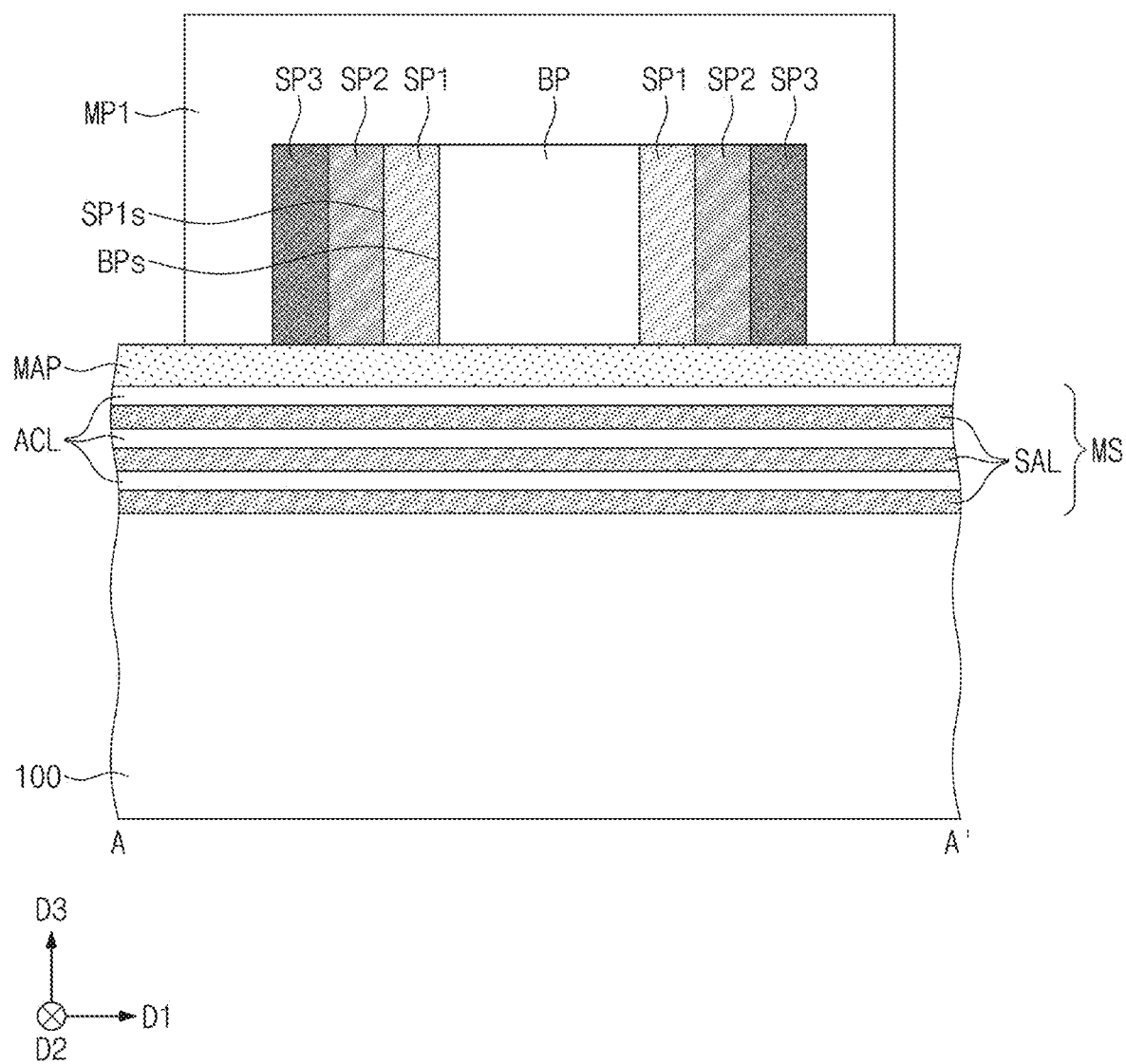

Referring to FIGS. 12 and 13, a first upper mask pattern MP1 may be formed on the first region R1 of the substrate 100. The first upper mask pattern MP1 may be formed to run across the first spacer SP1, the second spacer SP2, the third spacer SP3, and the bar pattern BP. The first upper mask pattern MP1 may have a width w5 in a second direction D2 greater than a sum w4 of widths in the second direction D2 of the first spacer SP1, the second spacer SP2, the third spacer SP3, and the bar pattern BP. The first upper mask pattern MP1 may cover an upper surface of the first spacer SP1, an upper surface of the second spacer SP2, an upper surface of the third spacer SP3, an upper surface of the bar pattern BP, and a lateral surface of the third spacer SP3. In addition, the first upper mask pattern MP1 may cover at least a portion of an upper surface of the hardmask layer HM.

Figure 14:
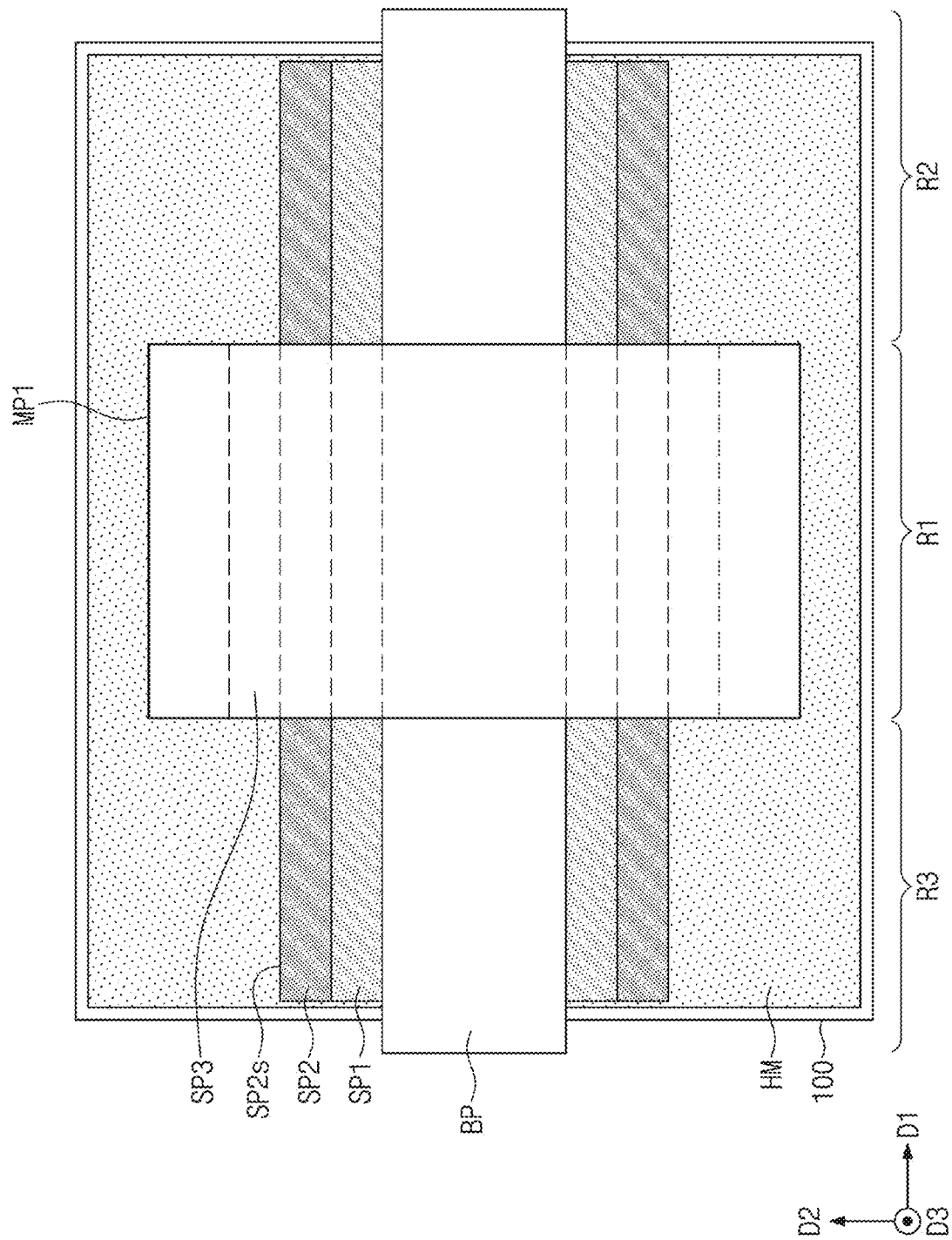

Referring to FIG. 14, the first upper mask pattern MP1 may be used to remove a portion of the third spacer SP3. The partial removal of the third spacer SP3 may include allowing the third spacer SP3 to undergo an etching process in which the first upper mask pattern MP1 is used as an etching mask. The partial removal of the third spacer SP3 may include selectively etching the third spacer SP3 with respect to the first spacer SP1 and the second spacer SP2. The third spacer SP3 may include a material having an etch selectivity with respect to the first spacer SP1 and the second spacer SP2. The first upper mask pattern MP1 may cover the third spacer SP3 on the first region R1, but may not cover the third spacer SP3 on the second and third regions R2 and R3. Thus, as the etching process is performed in which the first upper mask pattern MP1 is used as an etching mask, the third spacer SP3 may be selectively removed from the second and third regions R2 and R3. A lateral surface SP2s of the second spacer SP2 may be exposed on the second and third regions R2 and R3.

Figure 15:
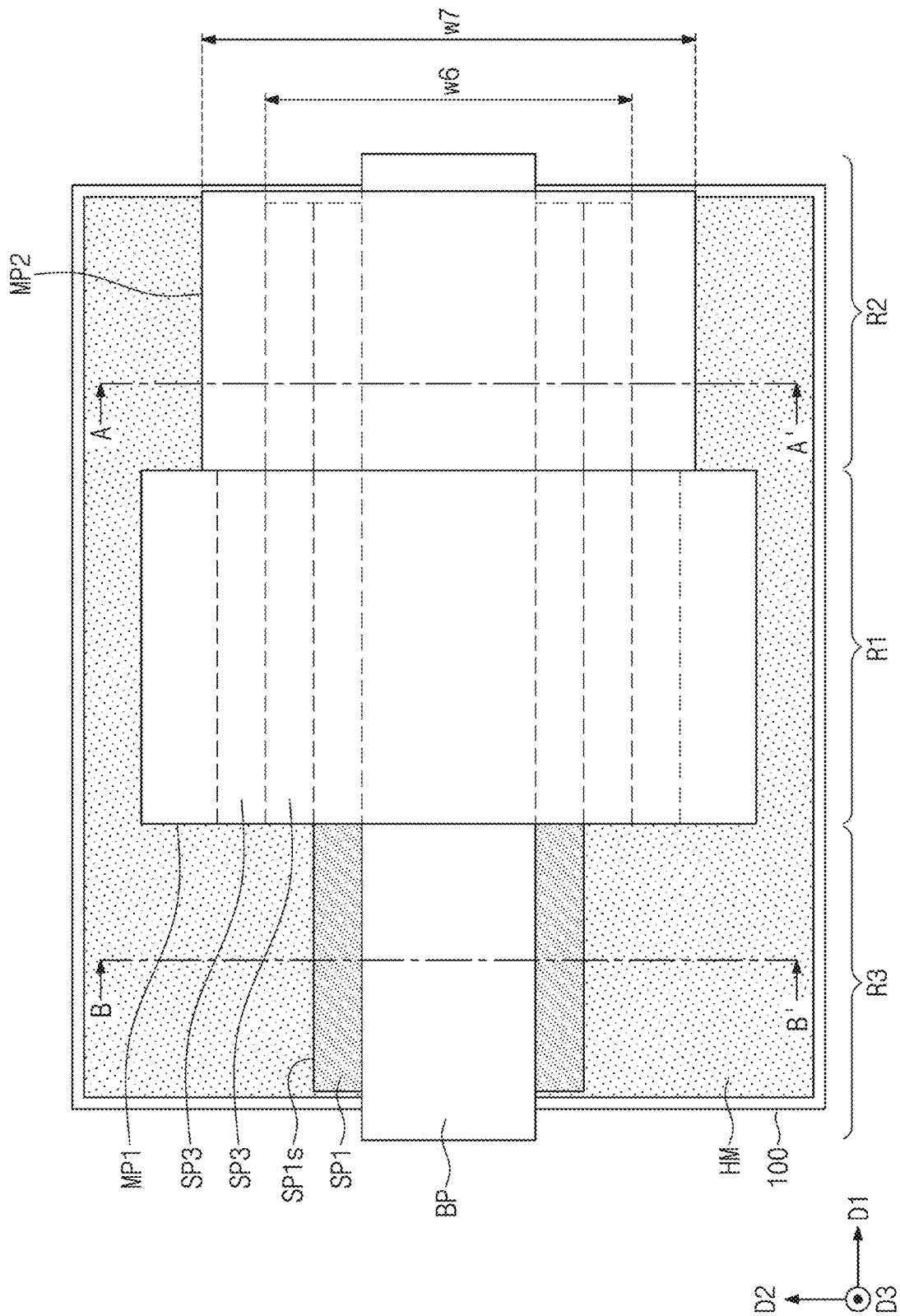
Figure 16:
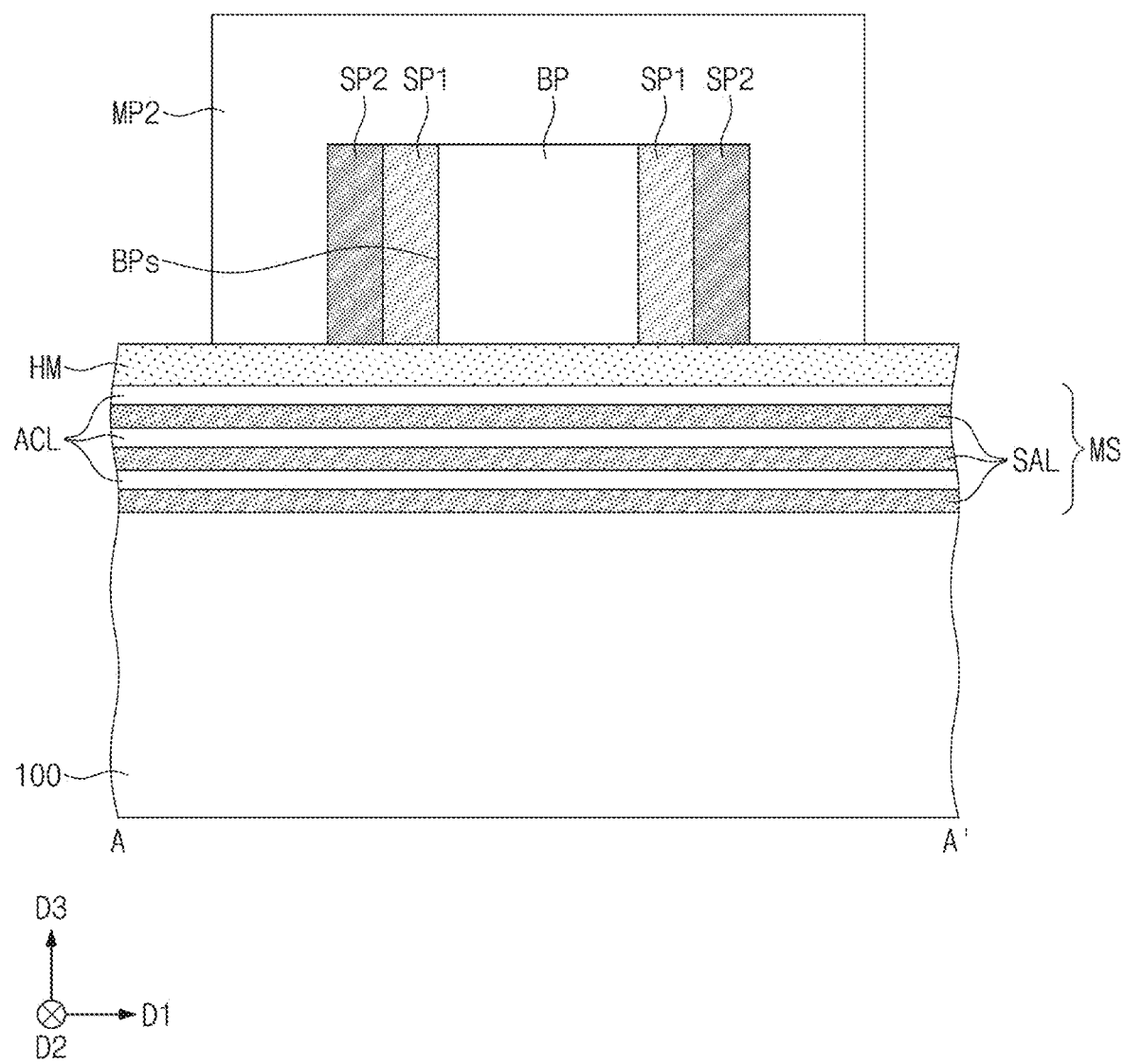
Figure 17:
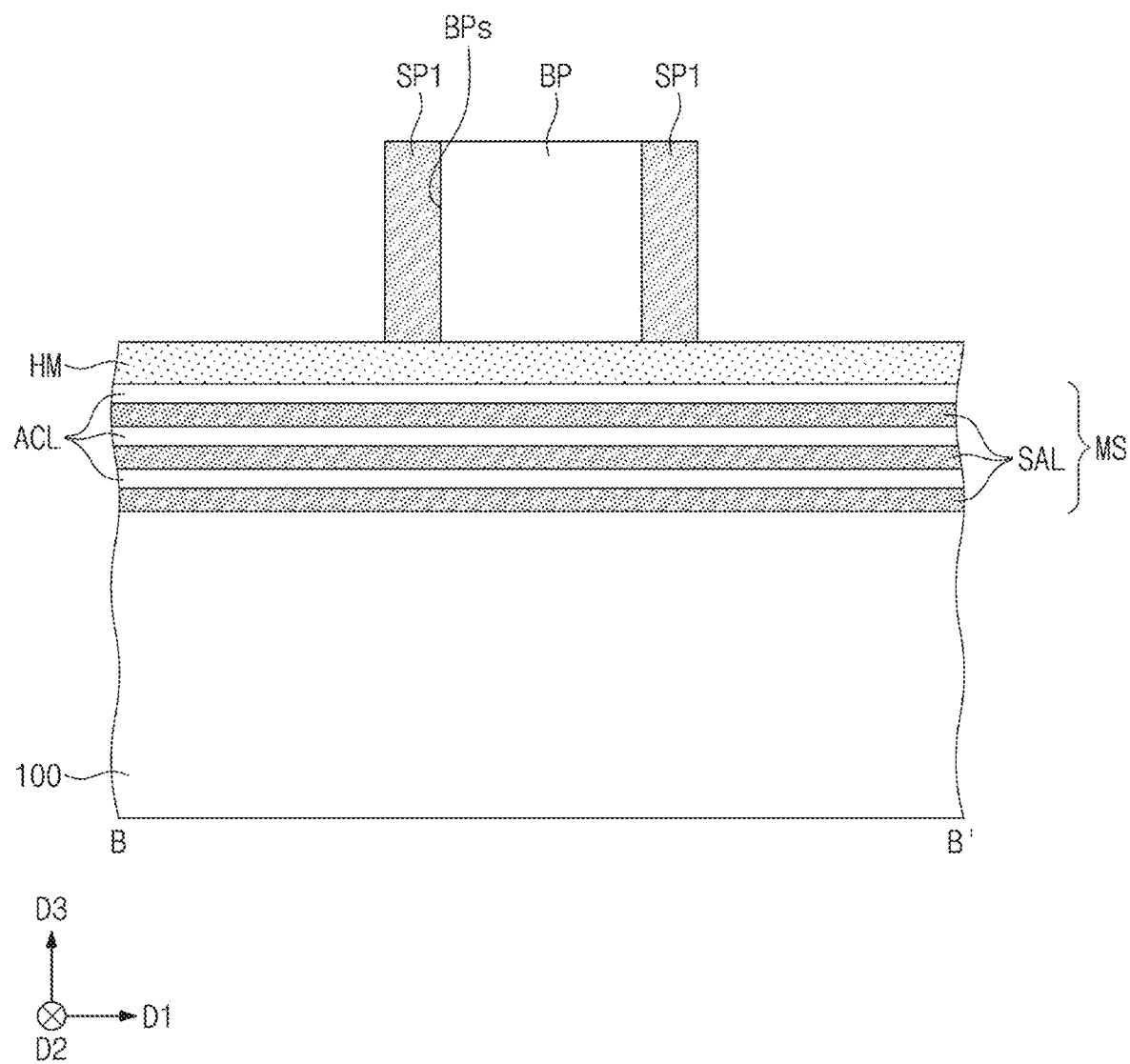
FIGS. 17, 21, 25, 29, 32, 35, and 38 are respective cross-sectional views taken along line B-B' of FIGS. 14, 19, 23, 27, 30, 33, and 36 and illustrate a method of fabricating a semiconductor device according to embodiments of the inventive concept.

Referring to FIGS. 15, 16, and 17, a second upper mask pattern MP2 may be formed on the second region R2 of the substrate 100. The second upper mask pattern MP2 may have a width w7 in the second direction D2 greater than a sum w6 of widths in the second direction D2 of the first spacer SP1, the second spacer SP2, and the bar pattern BP. In addition, the width w7 in the second direction D2 of the second upper mask pattern MP2 may be less than the width (see w5 of FIG. 12) in the second direction D2 of the first upper mask pattern MP1. The second upper mask pattern MP2 may cover the upper surface of the first spacer SP1, the upper surface of the second spacer SP2, the upper surface of the bar pattern BP, and a lateral surface of the second spacer SP2. In addition, the second upper mask pattern MP2 may cover a portion of the upper surface of the hardmask layer HM.

Thereafter, the first and second mask patterns MP1 and MP2 may be used to remove a portion of the second spacer SP2. The partial removal of the second spacer SP2 may include allowing the second spacer SP2 to undergo an etching process in which the first and second mask patterns MP1 and MP2 are used as an etching mask. For example, the first upper mask pattern MP1 may cover the first, second, and third spacers SP1, SP2, and SP3 on the first region R1, and the second upper mask pattern MP2 may cover the first and second spacers SP1 and SP2 on the second region R2. Therefore, neither the first mask upper mask pattern MP1 nor the second upper mask pattern MP2 may cover the first and second spacers SP1 and SP2 on the third region R3. The second spacer SP2 may be selectively etched with respect to the first spacer SP1. The second spacer SP2 may be removed which is provided on the third region R3 covered with neither the first upper mask pattern MP1 nor the second upper mask pattern MP2. On the third region R3, the lateral surface SP1s of the first spacer SP1 may be exposed.

Figure 18:
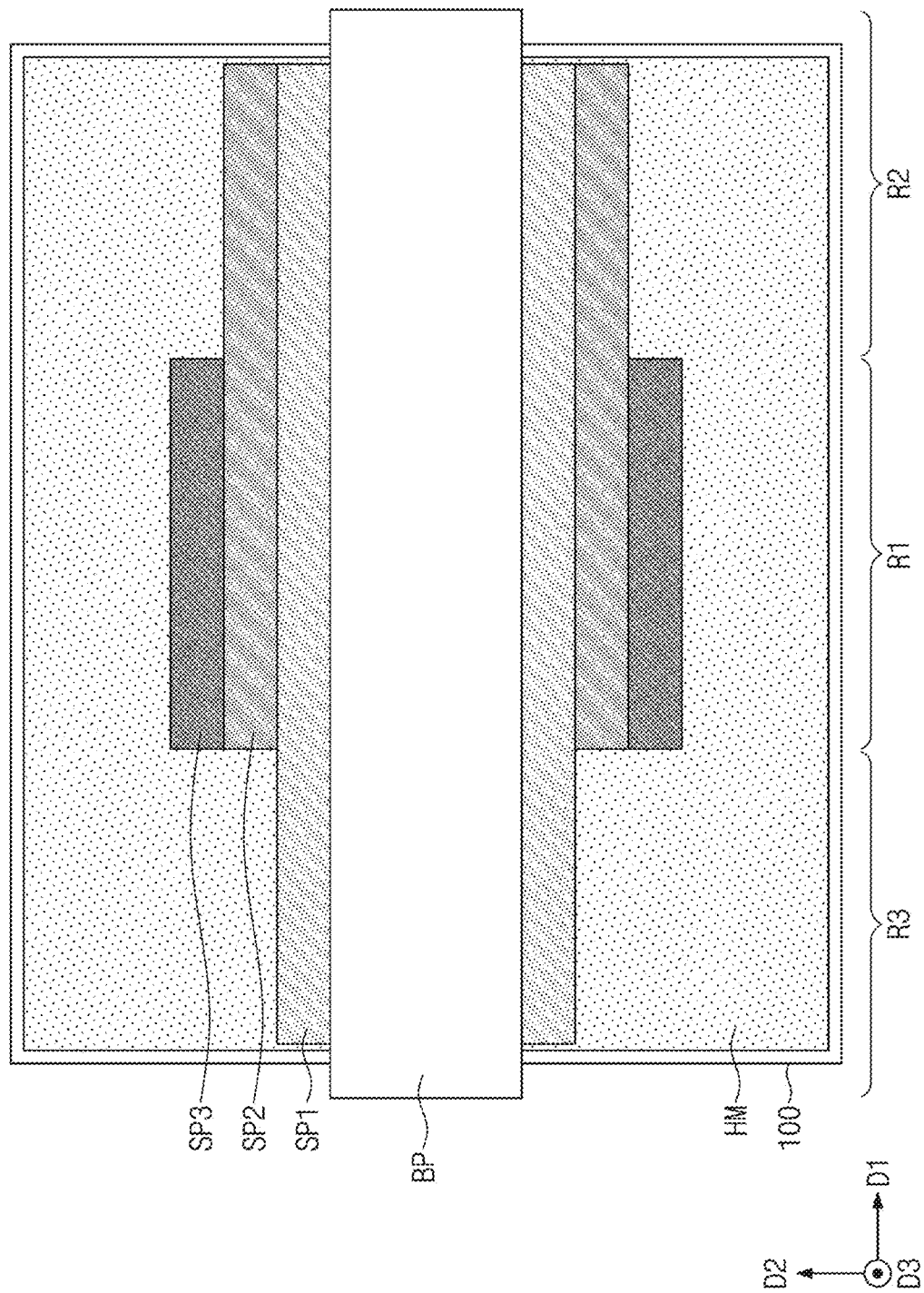
Figure 19:
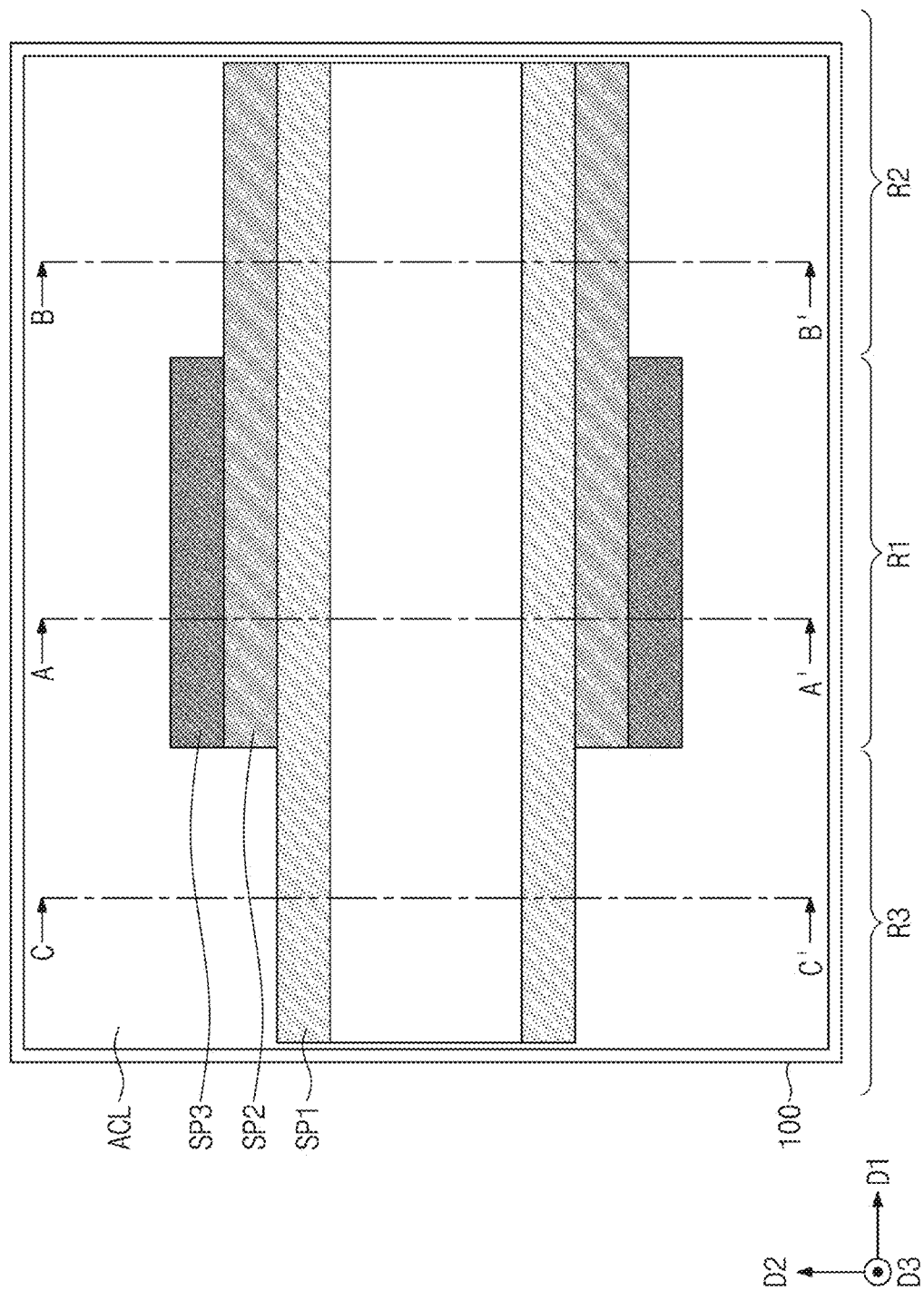
Figure 20:
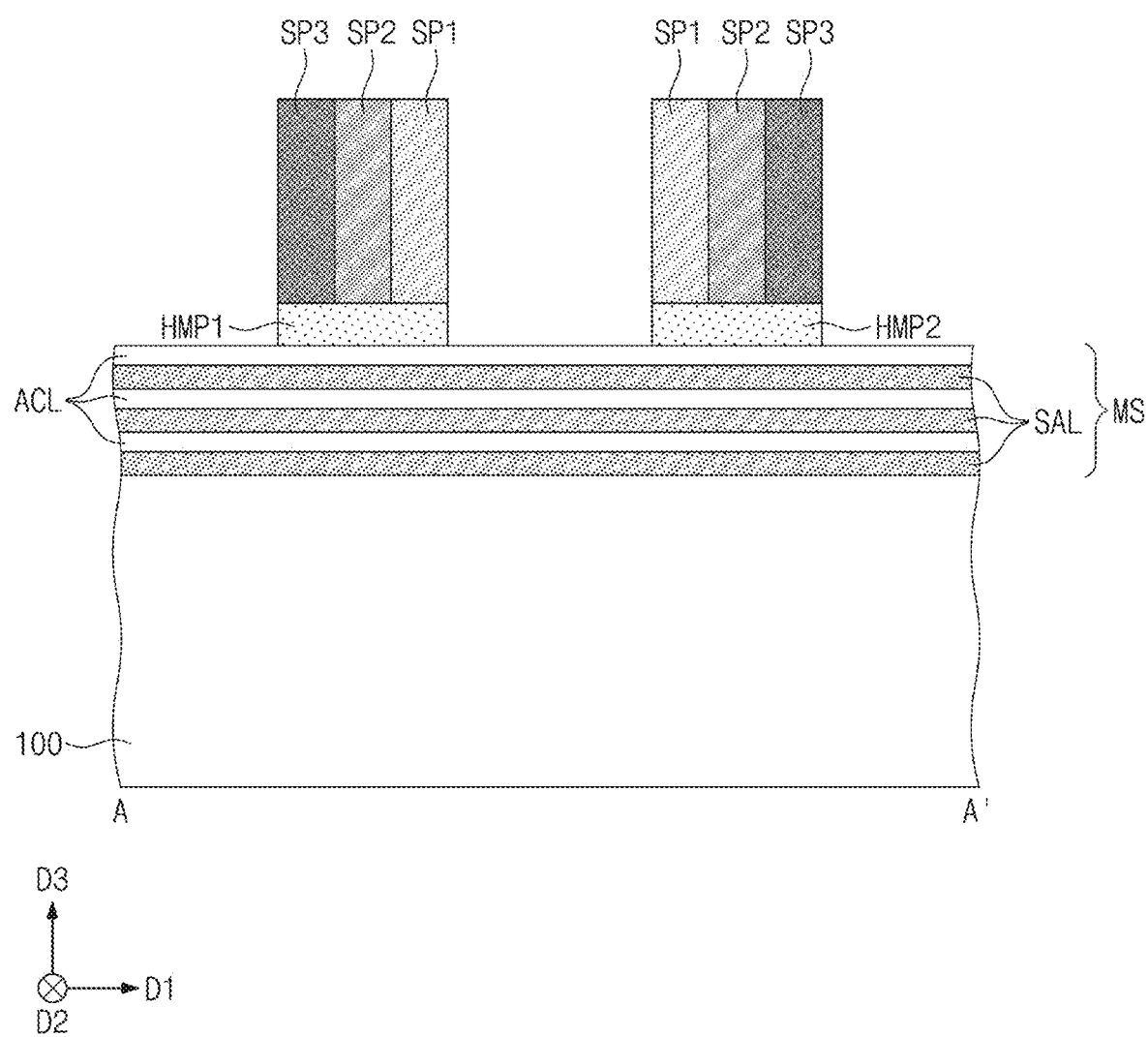
Figure 21:
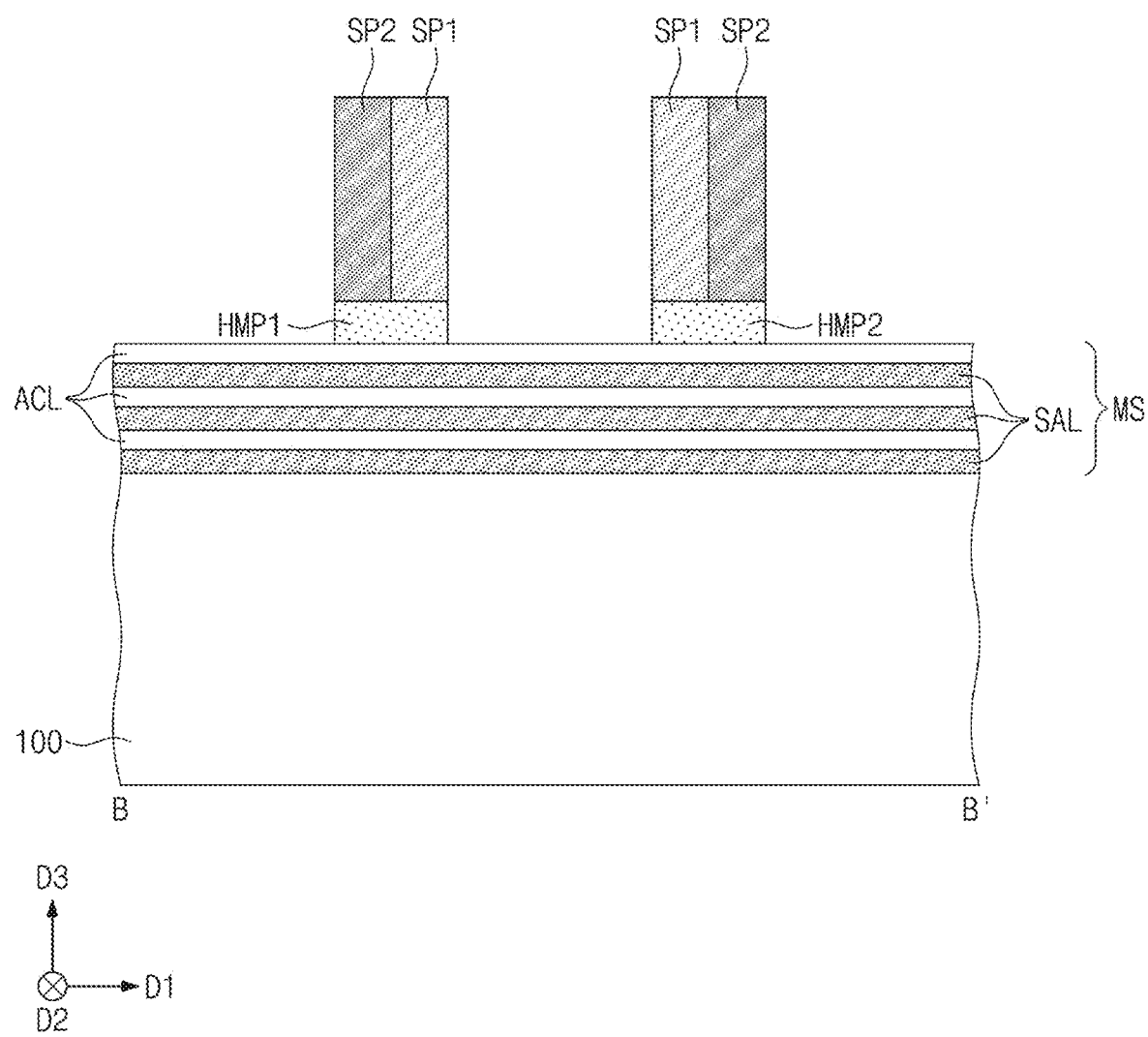

Referring to FIG. 18, the first and second upper mask patterns MP1 and MP2 may be removed. The removal of the first and second upper mask patterns MP1 and MP2 may completely expose the upper surface of the bar pattern BP and the upper surfaces of the first, second, and third spacers SP1, SP2, and SP3.

Referring to FIGS. 19, 20, 21 and 22, the bar pattern BP may be removed. In some embodiments, the bar pattern BP may include a material having an etch selectivity with respect to the first, second, and third spacers SP1, SP2, and SP3. In some embodiments, the removal of the bar pattern BP may include performing a wet etching process in which the bar pattern BP is selectively etched with respect to the first, second, and third spacers SP1, SP2, and SP3.

Thereafter, the first, second, and third spacers SP1, SP2, and SP3 may be used to pattern the hardmask layer HM. The patterning of the hardmask layer HM may include allowing the hardmask layer HM to undergo an etching process in which the first, second, and third spacers SP1, SP2, and SP3 are used as an etching mask. The hardmask layer HM may be patterned to form a first hardmask pattern HMP1 and a second hardmask pattern HMP2. The first and second hardmask patterns HMP1 and HMP2 may be spaced apart in the second direction D2. For example, an anisotropic etching process may be employed to perform the etching process on the hardmask layer HM.

Referring to FIGS. 23, 24, 25 and 26, the mold structure MS and the substrate 100 may undergo an etching process in which the first and second hardmask patterns HMP1 and HMP2 are used as an etching mask to form a first active pattern AP1 and a second active pattern AP2. The first and second active patterns AP1 and AP2 may include the active layers ACL of the mold structure MS patterned by the etching process, and may also include upper portions of the substrate 100 patterned by the etching process.

Figure 27:
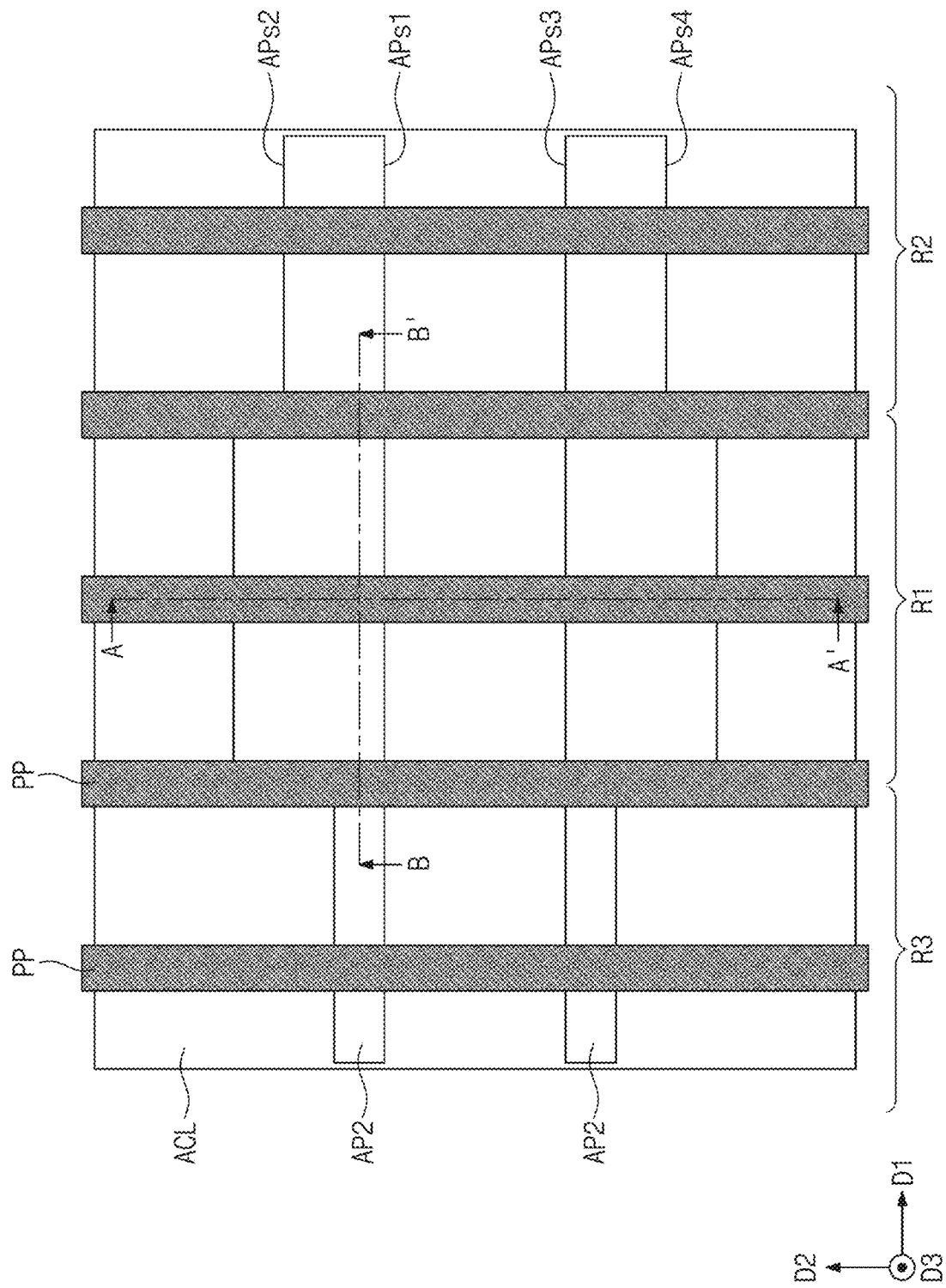
Figure 28:
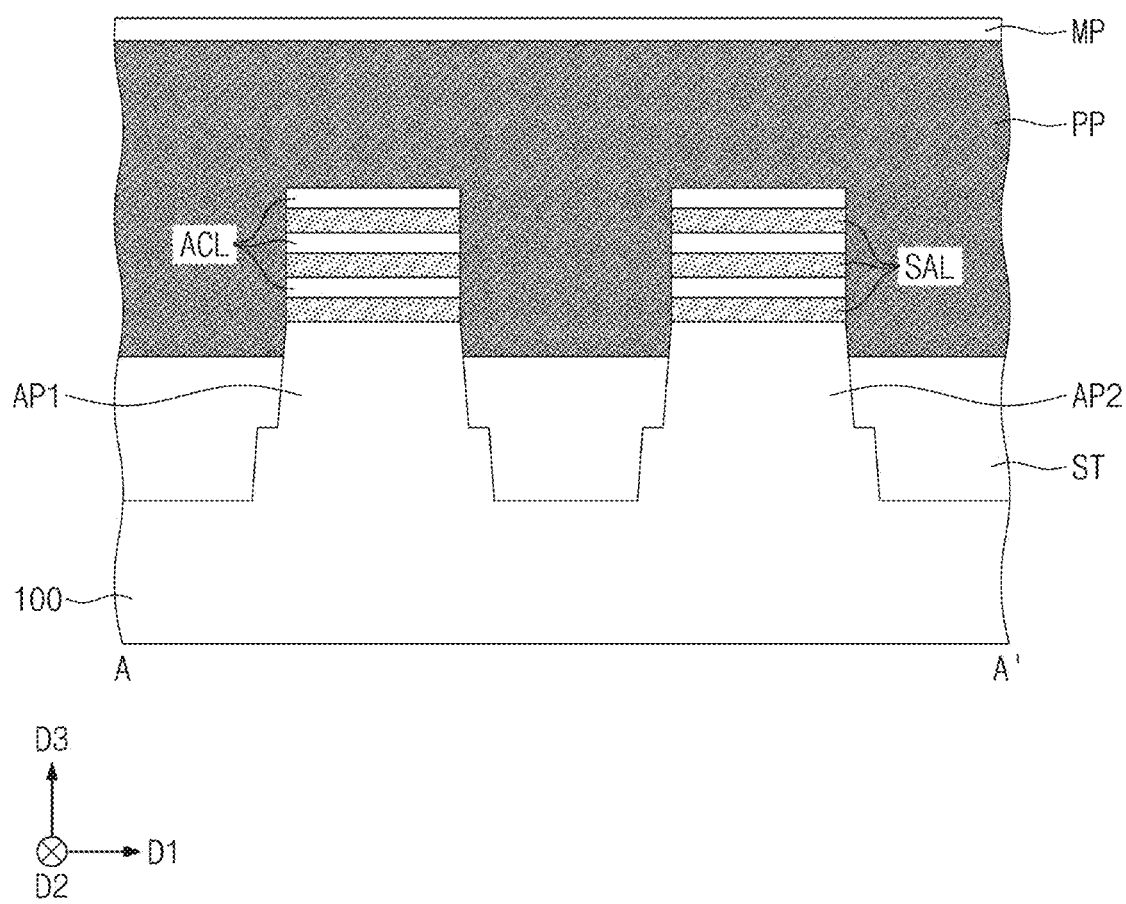
Figure 29:
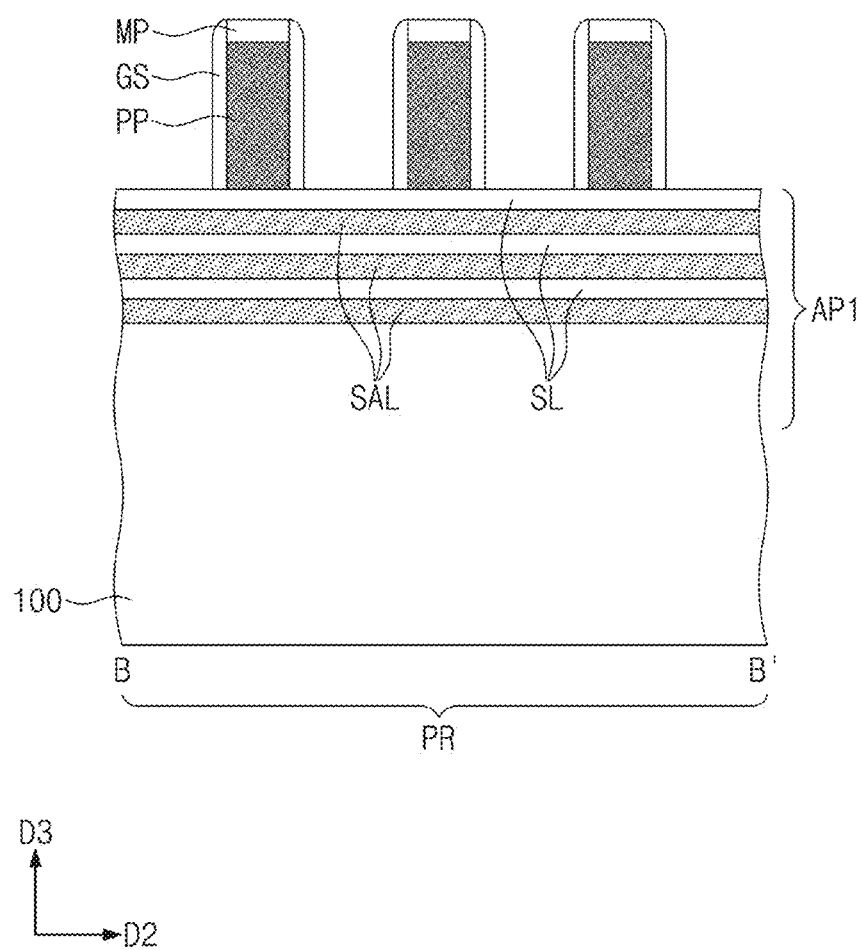

Referring to FIGS. 27, 28 and 29, on the substrate 100, sacrificial patterns PP may be formed to run across the first and second active patterns AP1 and AP2. Each of the sacrificial patterns PP may be formed to have a linear or bar shape that extends in the second direction D2.

For example, the formation of the sacrificial patterns PP may include forming a sacrificial layer on an entire surface of the substrate 100, forming gate hardmask patterns MP on the sacrificial layer, and using the gate hardmask patterns MP as an etching mask to pattern the sacrificial layer. The sacrificial layer may include polysilicon. Before the formation of the sacrificial patterns PP, a device isolation layer ST may be formed between the first and second active patterns AP1 and AP2. The device isolation layer ST may include, for example, silicon oxide.

In some embodiments, the patterning processes used to form the bar pattern BP, the first upper mask pattern MP1, the second upper mask pattern MP2, and the sacrificial patterns PP may include a lithography process using an extreme ultraviolet (EUV) radiation. Here, the term "EUV" denotes ultraviolet energy having a wavelength ranging from about 4 nm to about 124 nm (e.g., about 4 nm to about 20 nm, or more particularly in some embodiments about 13.5 nm). Thus, the term "EUV" may denote energy ranging from about 6.21 eV to about 124 eV (e.g., about 90 eV to about 95 eV).

The EUV lithography process may include exposure and development processes in which the EUV is irradiated onto a photoresist layer. For example, the photoresist layer may be an organic photoresist that contains an organic polymer such as polyhydroxystyrene. The organic photoresist may further include a photosensitive compound that is sensitive to the EUV. The organic photoresist may additionally include a material whose EUV absorption coefficient is high, for example, an organometallic material, an iodine-containing material, or a fluorine-containing material. For another example, the photoresist layer may be an inorganic photoresist that contains an inorganic material, such as tin oxide.

The photoresist layer may be formed with a relatively small thickness. The photoresist layer exposed to the EUV may be developed to form photoresist patterns. When viewed in plan, the photoresist patterns may have a linear shape that extends in one direction, an island shape, a zigzag shape, a honeycomb shape, or a circular shape, but the inventive concept is not limited thereto.

The photoresist patterns may be used as an etching mask to pattern one or more mask layers that are stacked thereunder, and the gate hardmask patterns MP may be formed as discussed above. The gate hardmask patterns MP may be used an etching mask to pattern a target layer or the sacrificial layer to form desired patterns on the substrate 100.

In some embodiments, the EUV lithography process may be used to perform not only the patterning processes for forming the bar pattern BP, the first upper mask pattern MP1, the second upper mask pattern MP2, and the sacrificial patterns PP, but also the patterning processes for forming other components discussed above.

A pair of gate spacers GS may be formed on both sidewalls of each of the sacrificial patterns PP. The formation of the gate spacers GS may include conformally forming a gate spacer layer on the entire surface of the substrate 100 and anisotropically etching the gate spacer layer. The gate spacer layer may include at least one of SiCN, SiCON, and SiN. Alternately, the gate spacer layer may be a multilayer including at least two of SiCN, SiCON, and SiN.

Figure 30:
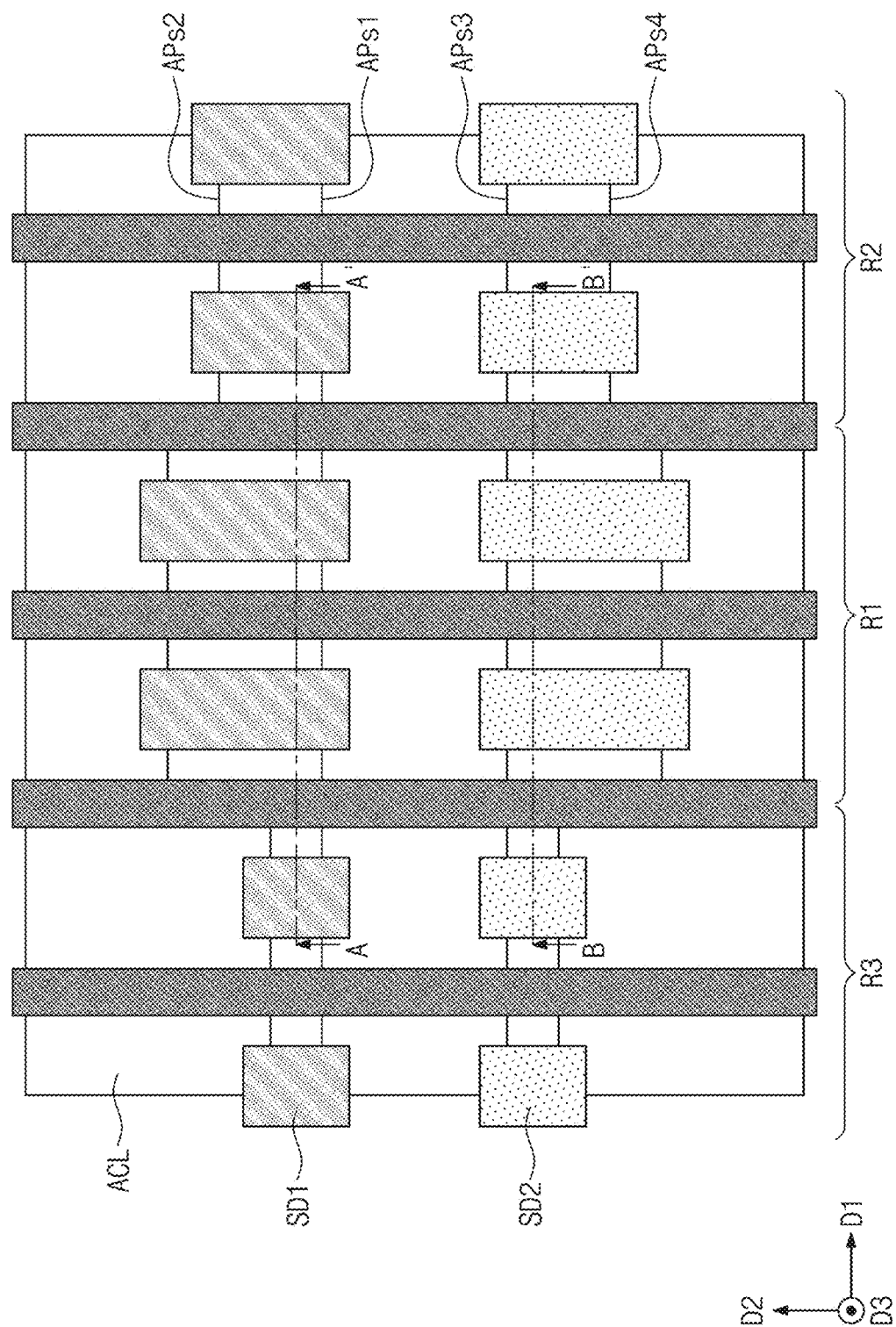
Figure 31:
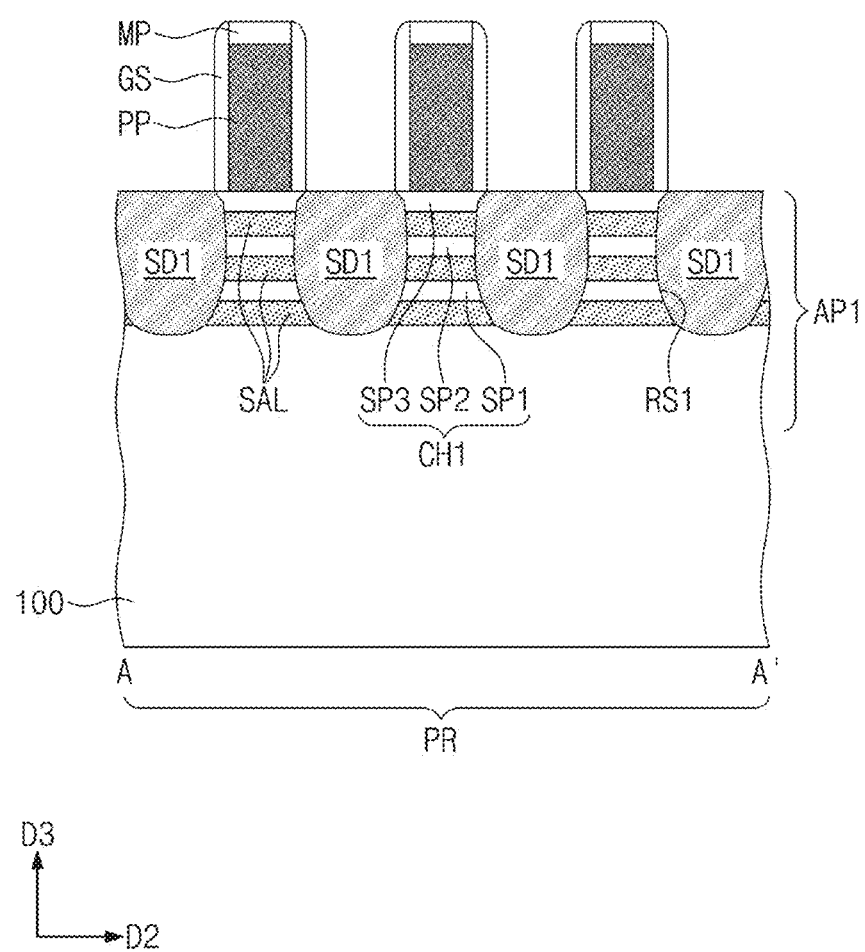
Figure 32:
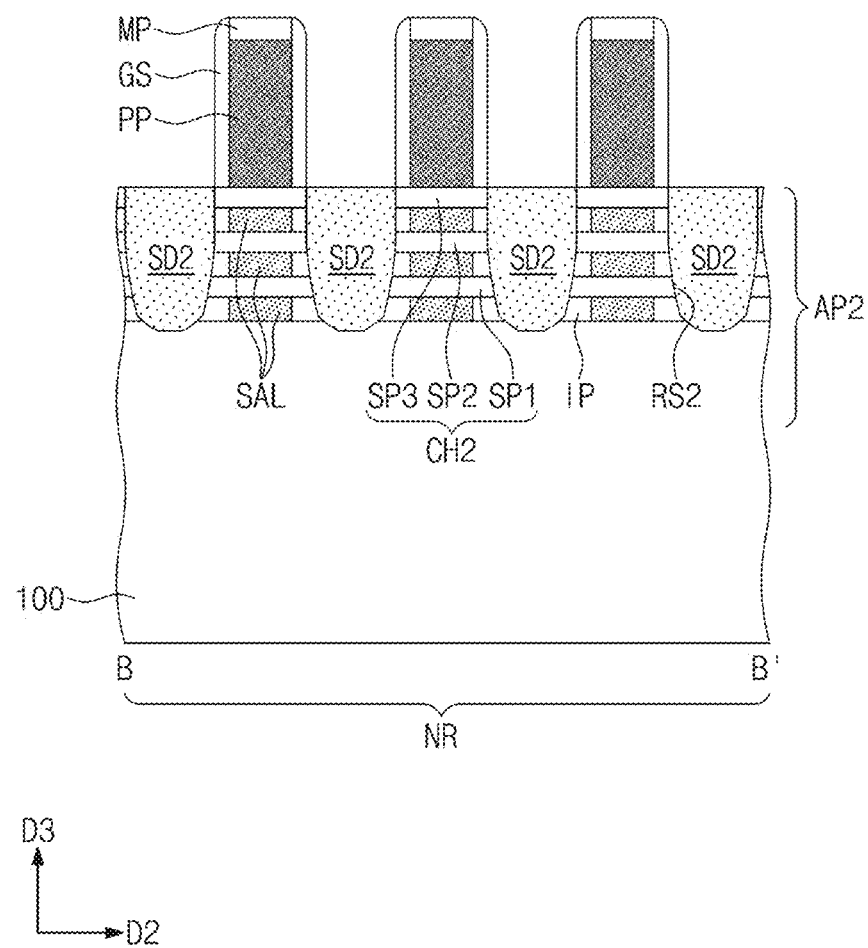

Referring to FIGS. 30, 31 and 32, first and second source/drain patterns SD1 and SD2 may be respectively formed on the first and second active patterns AP1 and AP2. For example, the first source/drain patterns SD1 may be formed on an upper portion of the first active pattern AP1. A pair of first source/drain patterns SD1 may be formed on both sides of the sacrificial pattern PP. For example, the gate hardmask patterns MP and the gate spacers GS may be used as an etching mask to etch the upper portion of the first active pattern AP1, with the result that first recessions RS1 may be formed.

The first source/drain pattern SD1 may be formed by performing a selective epitaxial growth process in which an inner wall of the first recession RS1 of the first active pattern AP1 is used as a seed layer. The formation of the first source/drain patterns SD1 may define a first channel pattern CH1 that includes first, second, and third semiconductor patterns SP1, SP2, and SP3 between a pair of first source/drain patterns SD1. For example, the selective epitaxial growth process may include chemical vapor deposition (CVD) or molecular beam epitaxy (MBE). The first source/drain patterns SD1 may include a semiconductor element (e.g., SiGe) having a lattice constant greater than that of a semiconductor element of the substrate 100. Each of the first source/drain patterns SD1 may be formed of one or more semiconductor layers.

For example, impurities may be in-situ implanted during the selective epitaxial growth process for forming the first source/drain patterns SD1. For another example, after the first source/drain patterns SD1 are formed, impurities may be implanted into the first source/drain patterns SD1. The first source/drain patterns SD1 may be doped to have a first conductivity type (e.g., P-type).

The second source/drain patterns SD2 may be formed on an upper portion of the second active pattern AP2. A pair of second source/drain patterns SD2 may be formed on both sides of the sacrificial pattern PP. The formation of the second source/drain patterns SD2 may define a second channel pattern CH2 that includes first, second, and third semiconductor patterns SP1, SP2, and SP3 between the pair of second source/drain patterns SD2.

For example, the gate hardmask patterns MP and the gate spacers GS may be used as an etching mask to etch the upper portion of the second active pattern AP2, with the result that second recessions RS2 may be formed. The second source/drain pattern SD2 may be formed by performing a selective epitaxial growth process in which an inner wall of the second recession RS2 of the second active pattern AP2 is used as a seed layer. For example, the second source/drain patterns SD2 may include the same semiconductor element (e.g., Si) as that of the substrate 100. The second source/drain patterns SD2 may be doped to have a second conductivity type (e.g., N-type).

Before the formation of the second source/drain patterns SD2, the sacrificial layers SAL may be partially removed which are exposed to the second recessions RS2. A dielectric material may substantially fill areas from which portions of the sacrificial layers SAL were removed, thereby forming dielectric patterns IP.

Figure 33:
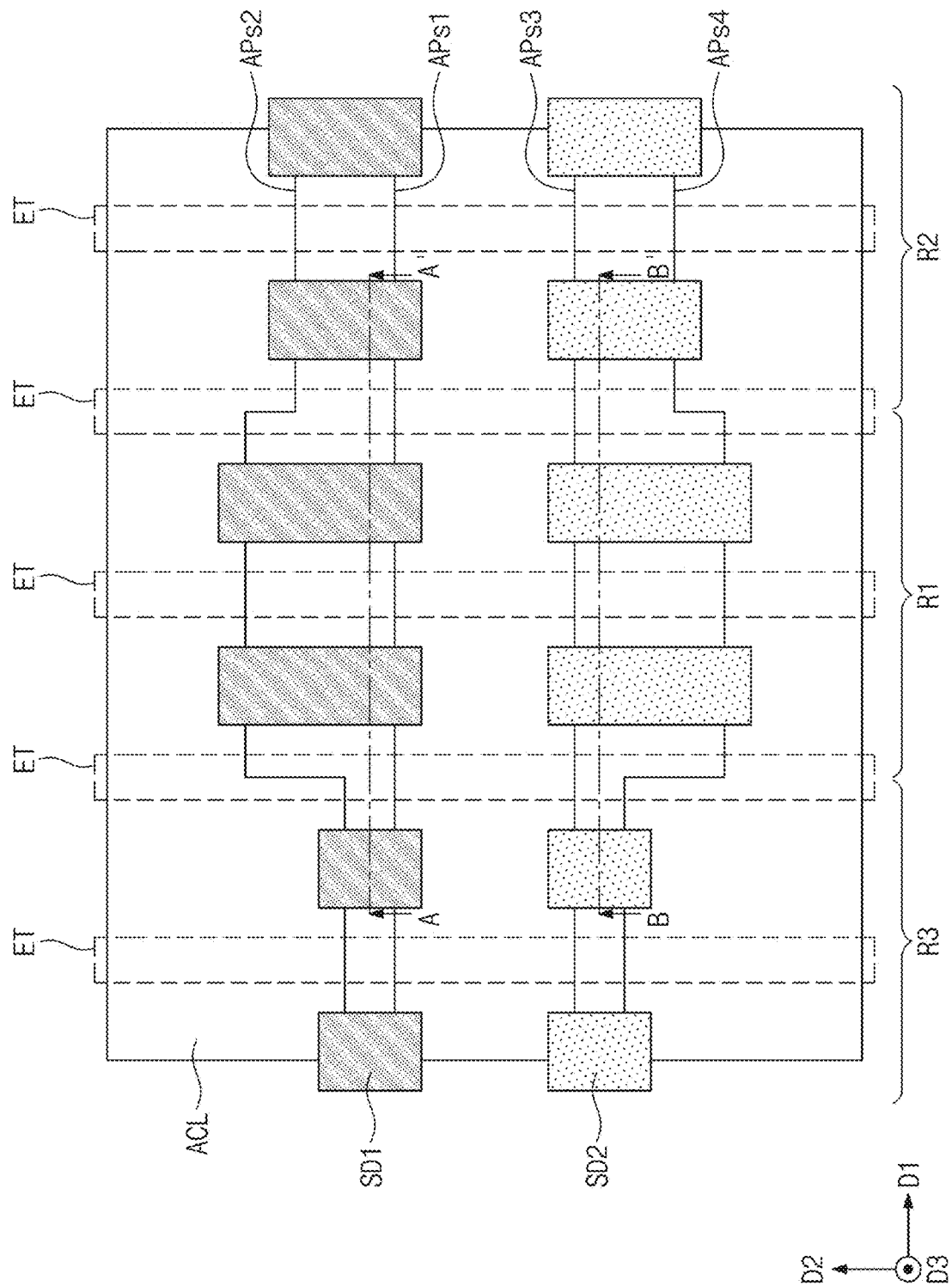
Figure 34:
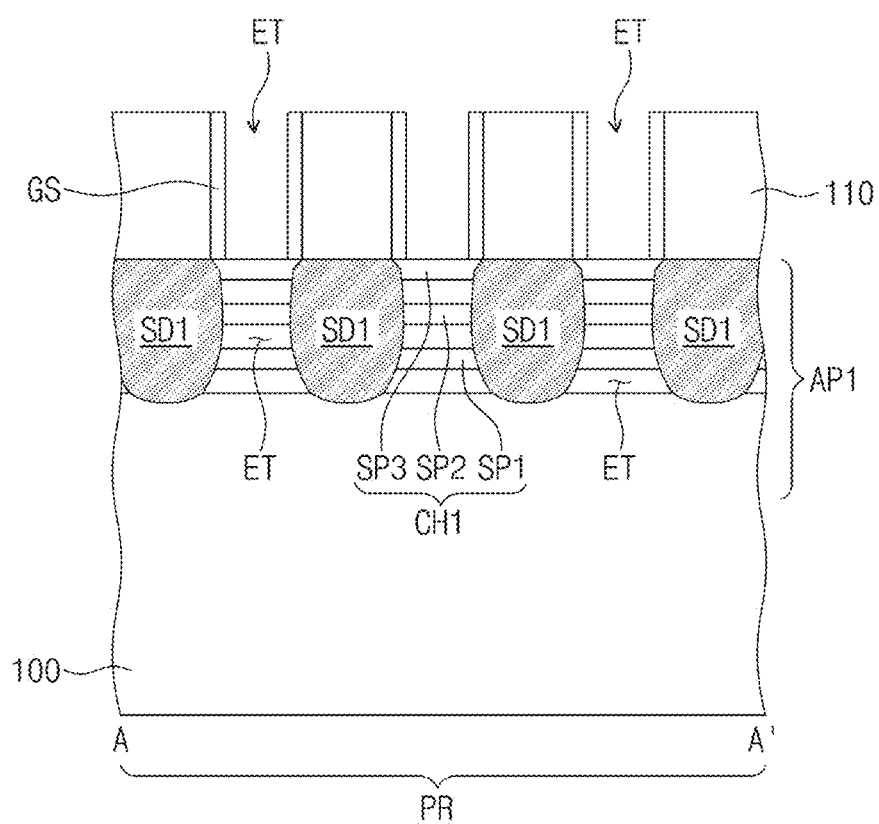
Figure 35:
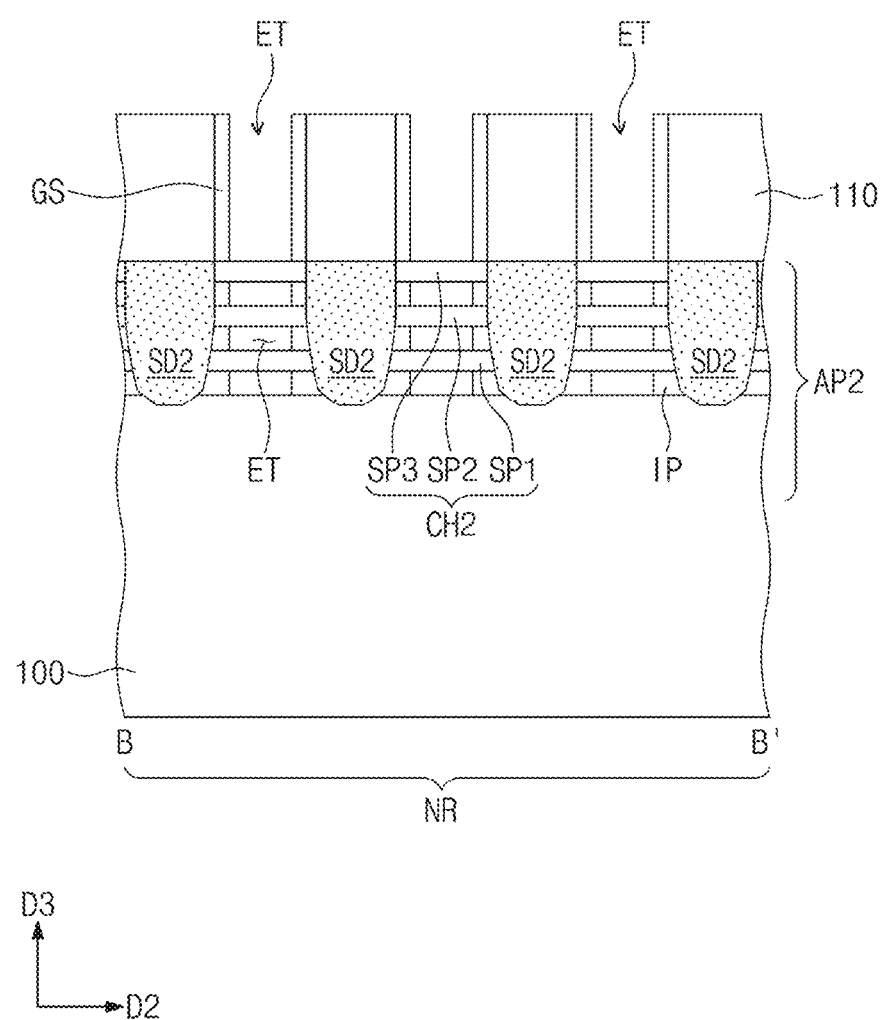

Referring to FIGS. 33, 34 and 35, a first interlayer dielectric layer 110 may be formed to cover the first and second source/drain patterns SD1 and SD2, the gate hardmask patterns MP, and the gate spacers GS. For example, the first interlayer dielectric layer 110 may include a silicon oxide layer.

The first interlayer dielectric layer 110 may be planarized until upper surfaces of the sacrificial patterns PP are exposed. An etch-back and/or chemical mechanical polishing (CMP) process may be employed to planarize the first interlayer dielectric layer 110. The gate hardmask patterns MP may be completely removed during the planarization process. As a result, the first interlayer dielectric layer 110 may have an upper surface coplanar with those of the sacrificial patterns PP and those of the gate spacers GS.

The sacrificial patterns PP and the sacrificial layers SAL may be selectively removed. The selective removal of the sacrificial patterns PP and the sacrificial layers SAL may form empty spaces ET exposing the first and second active patterns AP1 and AP2.

Figure 36:
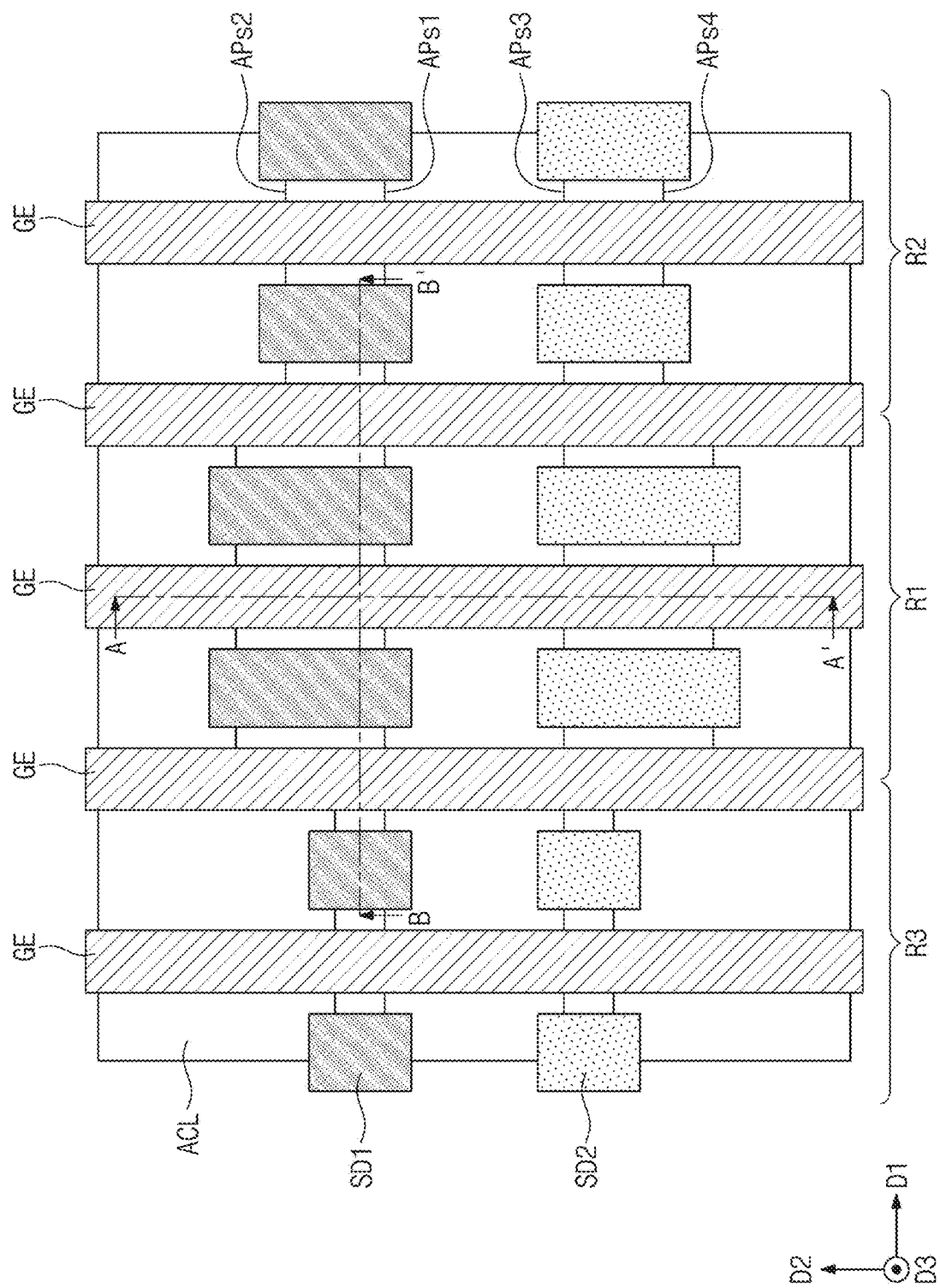
Figure 37:
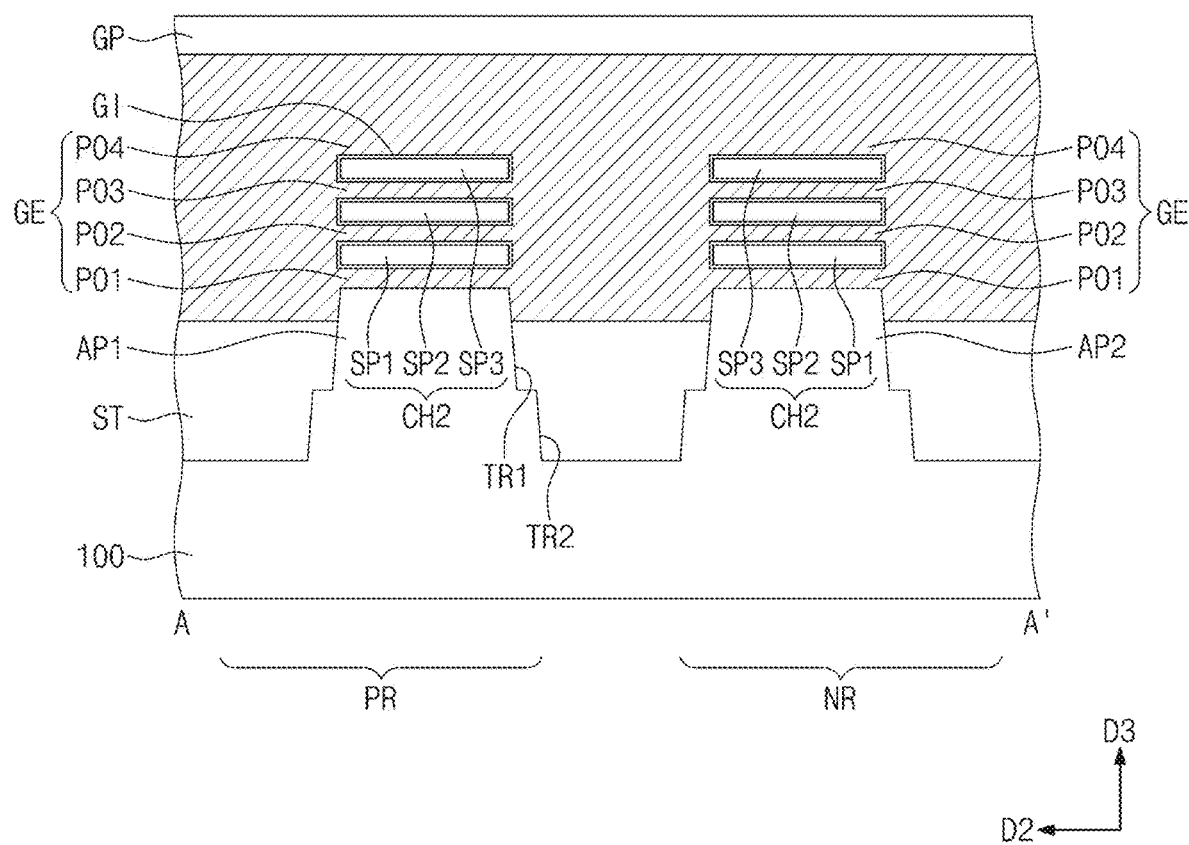
Figure 38:
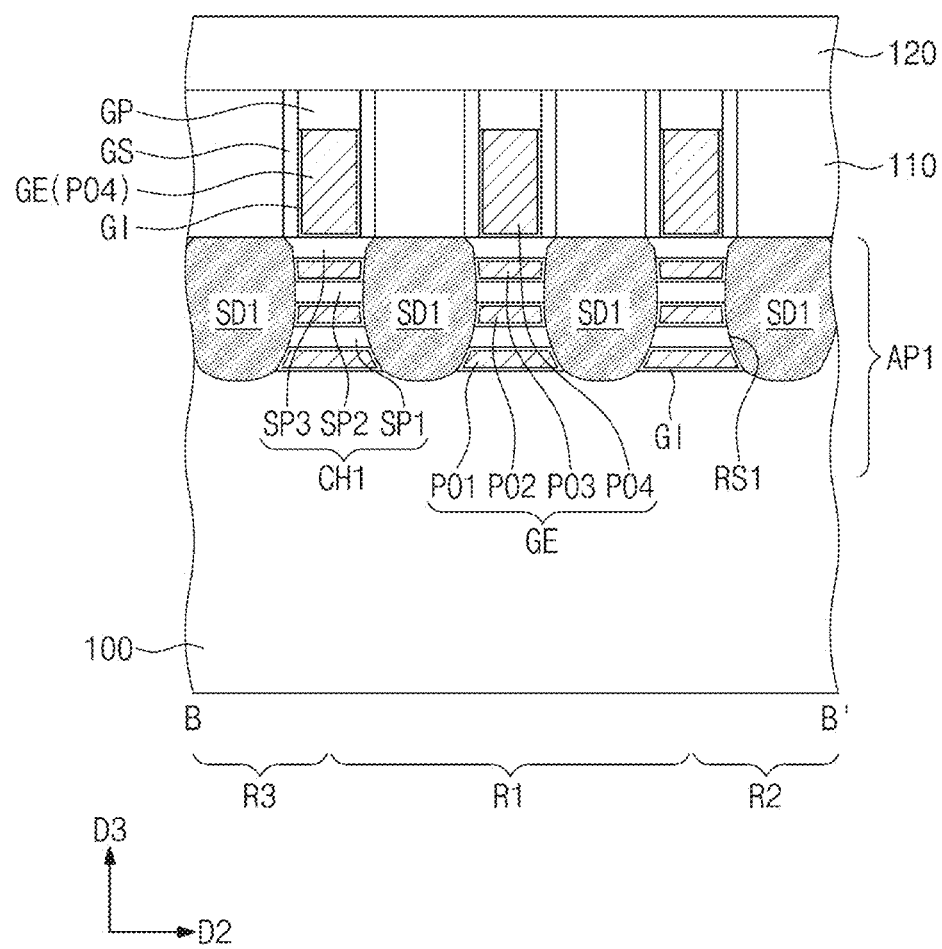

Referring to FIGS. 36, 37 and 38, gate dielectric layers GI may be formed in corresponding empty spaces ET. Gate electrodes GE may be formed in the empty spaces ET. Each gate electrode GE may include first, second, and third parts PO1, PO2, and PO3 that substantially fill an empty space ET between the first, second, and third semiconductor patterns SP1, SP2, and SP3, and may also include a fourth part PO4 that substantially fills the empty space ET between the gate spacers GS. Thereafter, gate capping patterns GP may be formed on the gate electrodes GE.

Referring back to FIG. 1 and FIGS. 2A to 2F, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 and to have electrical connection with the first and second source/drain patterns SD1 and SD2. Gate contacts GC may be formed to penetrate the second interlayer dielectric layer 120 and the gate capping pattern GP and to have electrical connection with the gate electrodes GE.

A third interlayer dielectric layer 130 may be formed on the second interlayer dielectric layer 120. A first metal layer M1 may be formed in the third interlayer dielectric layer 130. The formation of the first metal layer M1 may include forming first lines ILL A fourth interlayer dielectric layer 140 may be formed on the first metal layer M1. A second metal layer M2 may be formed in the fourth interlayer dielectric layer 140. The formation of the second metal layer M2 may include forming second lines IL2.

In some embodiments, an EUV lithography process may be employed to form the first lines IL1 and/or the second lines IL2 in the first metal layer M1 and/or the second metal layer M2. Here, an EUV lithography process used during wiring processes, or back-end-of-line (BEOL) processes, may be substantially the same as that the EUV lithography process used to form the sacrificial patterns PP. For example, a distance less than or equal to about 45 nm may define a minimum pitch between the first lines IL1 formed using the EUV lithography process in certain embodiments of the inventive concept.

In some embodiments of the inventive concept, a number of spacers may be used to pattern a hardmask pattern for forming active patterns, and thus it is possible to provide a method of fabricating a semiconductor device exhibiting improved reliability.

Although certain embodiments of the inventive concept have been described with reference to accompanying figures, it will be understood that various changes in form and detail may be made therein without departing from the spirit and scope of the inventive concept. It therefore will be understood that the embodiments described above are illustrative in nature.

What is claimed is:

1. A semiconductor device, comprising:
   a substrate including a first region and a second region adjacent to the first region in a first direction;
   a pair of active patterns adjacently disposed on the substrate, wherein the pair of active patterns includes a first active pattern extending in the first direction and a second active pattern extending in parallel with the first active pattern;
   a first gate electrode on the first region and extending in a second direction that intersect the first direction across the first active pattern and the second active pattern; and
   a second gate electrode on the second region and extending in the second direction across the first active pattern and the second active pattern,
   wherein a width of the first active pattern is greater on the first region than on the second region,
   a width of the second active pattern is greater on the first region than on the second region, and
   an interval between the first active pattern and the second active pattern is constant from the first region to the second region.

2. The semiconductor device of claim 1, wherein the first active pattern has a first lateral surface facing the second active pattern and a second lateral surface opposing the first lateral surface, and
   the first active pattern has a step difference on the second lateral surface between the first region and the second region.

3. The semiconductor device of claim 2, further comprising:
   a third gate electrode extending in the second direction and covering the step difference.

4. The semiconductor device of claim 1, wherein the substrate includes a PMOSFET region and an NMOSFET region spaced apart in the second direction,
   the first active pattern is on the PMOSFET region, and
   the second active pattern is on the NMOSFET region.

5. The semiconductor device of claim 1, wherein the first active pattern has a first lateral surface facing the second active pattern and a second lateral surface opposing the first lateral surface,
   the second active pattern has a third lateral surface facing the first lateral surface and a fourth lateral surface opposing the third lateral surface, and
   a distance between the second lateral surface and the fourth lateral surface on the first region is greater than a distance between the second lateral surface and the fourth lateral surface on the second region.

6. The semiconductor device of claim 5, wherein a distance between the first lateral surface and the third lateral surface on the first region is substantially equal to a distance between the first lateral surface and the third lateral surface on the second region.

7. The semiconductor device of claim 1, wherein the first active pattern includes a plurality of first channel patterns and a plurality of first source/drain patterns that are alternately arranged along the first direction,
- wherein the second active pattern includes a plurality of second channel patterns and a plurality of second source/drain patterns that are alternately arranged along the first direction, and
- wherein a width of a first one of the plurality of first source/drain patterns that is on the first region is greater than a width of a second one of the plurality of first source/drain patterns that is on the second region.

8. The semiconductor device of claim 7, wherein a width of a first one of the plurality of second source/drain patterns that is on the first region is greater than a width of a second one of the plurality of second source/drain patterns that is on the second region.

9. The semiconductor device of claim 7, wherein a first conductivity type of each of the plurality of first source/drain patterns is different from a second conductivity type of each of the plurality of second source/drain patterns.

10. The semiconductor device of claim 7, wherein each of the first and second channel patterns includes a plurality of semiconductor patterns that are stacked and vertically spaced apart from each other, and
- wherein each of the first and second gate electrodes surrounds the plurality of semiconductor patterns.

11. A semiconductor device, comprising:
- a substrate including a first region and a second region adjacent to the first region in a first direction;
- an active pattern on the substrate, the active pattern extending from the first region to the second region in the first direction; and
- a gate electrode on the active pattern and extending in a second direction that intersect the first direction, the gate electrode being between the first region and the second region,
- wherein the active pattern has a first lateral surface and a second lateral surface opposing the first lateral surface,
- wherein the active pattern has a step difference on the second lateral surface between the first region and the second region, and
- wherein the step difference overlaps the gate electrode.

12. The semiconductor device of claim 11, wherein a width of the active pattern is greater on the first region than on the second region.

13. The semiconductor device of claim 11, wherein the active pattern includes a first source/drain pattern on the first region, a second source/drain pattern on the second region, and a channel pattern between the first and second source/drain patterns,
- wherein the gate electrode is provided on the channel pattern, and
- wherein the channel pattern has the step difference.

14. The semiconductor device of claim 13, wherein a width of the first source/drain pattern is greater than a width of the second source/drain pattern.

15. The semiconductor device of claim 13, wherein a width of the channel pattern adjacent to the first source/drain pattern is greater than a width of the channel pattern adjacent to the second source/drain pattern.

16. A semiconductor device, comprising:
- a substrate including a first region, a second region and a third region, the first region between the second region and the third region,
- an active pattern on the substrate, the active pattern extending from the third region through the first region to the second region;
- a first gate electrode on the active pattern between the first region and the second region; and
- a second gate electrode on the active pattern between the first region and the third region,
- wherein the active pattern has a first lateral surface and a second lateral surface opposing the first lateral surface,
- wherein the active pattern has a first step difference on the second lateral surface between the first region and the second region,
- wherein the active pattern has a second step difference on the second lateral surface between the first region and the third region,
- wherein the first step difference is less than the second step difference.

17. The semiconductor device of claim 16, wherein the first step difference overlaps the first gate electrode, and
- wherein the second step difference overlaps the second gate electrode.

18. The semiconductor device of claim 16, wherein the active pattern has a first width on the first region, a second width on the second region, and a third width on the third region, and
- wherein a difference between the first width and the second width is less than a difference between the first width and the third width.

19. The semiconductor device of claim 16, wherein the active pattern includes a first source/drain pattern on the first region, a second source/drain pattern on the second region, and a third source/drain pattern on the third region,
- wherein a width of the first source/drain pattern is greater than a width of the second source/drain pattern, and
- wherein the width of the second source/drain pattern is greater than a width of the third source/drain pattern.

20. The semiconductor device of claim 19, wherein the first, second and third source/drain patterns have the same conductivity type.

* * * * *